US012652814B2

(12) United States Patent　　　　　(10) Patent No.:　US 12,652,814 B2
Kamada et al.　　　　　　　　　　　　(45) Date of Patent:　Jun. 9, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Takuho Kamada, Tokyo (JP); Koji Ogata, Tokyo (JP); Kiyoyuki Satou, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 439 days.

(21) Appl. No.: 18/331,453

(22) Filed: Jun. 8, 2023

(65) Prior Publication Data

US 2024/0030321 A1　　Jan. 25, 2024

(30) Foreign Application Priority Data

Jul. 25, 2022　(JP) ................................. 2022-117638

(51) Int. Cl.
　　*H10D 12/00*　　　(2025.01)
　　*H10D 12/01*　　　(2025.01)
　　*H10D 62/10*　　　(2025.01)
(52) U.S. Cl.
　　CPC ......... *H10D 12/481* (2025.01); *H10D 12/038* (2025.01); *H10D 62/127* (2025.01)
(58) Field of Classification Search
　　CPC .. H10D 12/481; H10D 12/038; H10D 62/127; H10D 64/117; H10D 64/516; H10D 64/23; H10D 64/518; H10D 62/106; H10D 64/513
　　See application file for complete search history.

(56) References Cited

U.S. PATENT DOCUMENTS

| | | | |
|---|---|---|---|
| 9,041,050 B2 | 5/2015 | Matsuura | |
| 2018/0097102 A1 | 4/2018 | Baba et al. | |
| 2019/0035792 A1* | 1/2019 | Lu .......................... | H10B 12/34 |
| 2019/0103499 A1* | 4/2019 | Higashikawa ........ | H10F 19/908 |
| 2024/0395892 A1* | 11/2024 | Huang ................. | H10D 30/014 |

FOREIGN PATENT DOCUMENTS

| | | |
|---|---|---|
| JP | 2013-140885 A | 7/2013 |
| JP | 2018-056463 A | 4/2018 |

OTHER PUBLICATIONS

Office Action dated Oct. 7, 2025, issued in corresponding JP Application No. 2022-117638, 12 pages.

* cited by examiner

*Primary Examiner* — Mohammad A Rahman
(74) *Attorney, Agent, or Firm* — Rimon P.C.

(57)　　　　　　　ABSTRACT

A semiconductor device includes an n-type semiconductor substrate, a trench, and a gate electrode formed in the trench via a gate insulating film. An absolute value of a difference between a thickness of the gate insulating film formed on a corner portion of the trench and a thickness of the gate insulating film formed on the bottom portion of the trench is smaller than an absolute value of a difference between the thickness of the gate insulating film formed on the corner portion of the trench and a thickness of the gate insulating film formed on the sidewall portion of the trench.

15 Claims, 19 Drawing Sheets

<FIRST EMBODIMENT>

T1>T3, T2>T3
ΔTA = |T2−T1|
ΔTB = |T2−T3|
ΔTA > ΔTB

A–A CROSS-SECTION

A–A CROSS-SECTION

A–A CROSS–SECTION

A–A CROSS–SECTION

A–A CROSS–SECTION

A–A CROSS–SECTION

*FIG. 9*

A–A CROSS–SECTION

*FIG. 10*

A–A CROSS-SECTION

A-A CROSS-SECTION

\<FIRST EMBODIMENT\>

$T1>T3, \quad T2>T3$ $\Delta TA = |T2-T1|$ $\Delta TB = |T2-T3|$ $\Delta TA > \Delta TB$

\<FIRST EMBODIMENT\>

<FIRST EMBODIMENT>

R−(W−0.4)>W [μm]

<DISTRIBUTION OF WITHSTAND VOLTAGE>

<TDDB LIFETIME>

<SECOND EMBODIMENT>

R−(W−0.4)>W [μm]

T4>T6, T5>T6
$\Delta TC = |T5-T4|$
$\Delta TD = |T5-T6|$
$\Delta TC > \Delta TD$
$\Delta TA-\Delta TB > \Delta TC-\Delta TD$

<STUDIED EXAMPLE>

T1>T3, T2>T3
(T2>T1>T3)

$\Delta TA = |T2-T1|$ $\Delta TB = |T2-T3|$ $\Delta TA < \Delta TB$

<STUDIED EXAMPLE>

<STUDIED EXAMPLE>

SEMICONDUCTOR DEVICE AND METHOD OF MANUFACTURING THE SAME

CROSS-REFERENCE TO RELATED APPLICATIONS

The disclosure of Japanese Patent Application No. 2022-117638 filed on Jul. 25, 2022 including the specification, drawings and abstract is incorporated herein by reference in its entirety.

BACKGROUND

The present invention relates to a semiconductor device and a method of manufacturing the same, and relates in particular to a semiconductor device having a gate electrode formed in a trench and a method of manufacturing the same.

In recent years, semiconductor devices provided with a power semiconductor element such as an IGBT (Insulated Gate Bipolar Transistor) have been widely used. Also, a trench-gate type IGBT has been known as an IGBT with a low on-resistance.

There is disclosed a technique listed below.
[Patent Document 1] Japanese Unexamined Patent Application Publication No. 2013-140885

For example, Patent Document 1 discloses an IGBT with a GGEE structure. In such an IGBT, a trench is formed in an n-type semiconductor substrate and a gate electrode is buried in the trench via a gate insulating film. In Patent Document 1, $Cl_2$ gas and $O_2$ gas are used in the etching process for forming the trench, and the gate insulating film is then formed on an inner wall of the trench.

SUMMARY

As one of the reliability evaluations of power semiconductor elements, the evaluation of resistance against breakdown voltage can be presented. If there is variation in the thickness of the gate insulating film in the vicinity of the bottom portion of the trench, a portion locally having a low withstand voltage is formed, resulting in the decrease in reliability of the gate withstand voltage. Such a problem causes the decrease in yield and the increase in inspection cost.

A main object of this application is to improve the reliability of the semiconductor device by suppressing the variation in the thickness of the gate insulating film in the vicinity of the bottom portion of the trench. Other problems and novel features will become apparent from the description of this specification and the accompanying drawings.

An outline of the representative embodiment disclosed in this application will be briefly described below.

A semiconductor device according to one embodiment includes: a semiconductor substrate of a first conductivity type having an upper surface and a lower surface; a first trench formed in the semiconductor substrate on an upper surface side of the semiconductor substrate; a first insulating film formed in the first trench; and a conductive film buried in the first trench via the first insulating film. Here, the first trench includes: a first sidewall portion formed from the upper surface of the semiconductor substrate toward an inside of the semiconductor substrate to a predetermined depth; a first bottom portion located inside the semiconductor substrate; and a first corner portion connecting the first sidewall portion and the first bottom portion. Further, an absolute value $\Delta TB$ of a difference between a thickness of the first insulating film formed on the first corner portion and a thickness of the first insulating film formed on the first bottom portion is smaller than an absolute value $\Delta TA$ of a difference between the thickness of the first insulating film formed on the first corner portion and a thickness of the first insulating film formed on the first sidewall portion.

A method of manufacturing a semiconductor device according to one embodiment includes: (a) preparing a semiconductor substrate of a first conductivity type having an upper surface and a lower surface; (b) forming a first trench in the semiconductor substrate on an upper surface side of the semiconductor substrate; (c) forming a first insulating film in the first trench; and (d) forming a conductive film so as to fill the first trench via the first insulating film. Here, the first trench includes: a first sidewall portion formed from the upper surface of the semiconductor substrate toward an inside of the semiconductor substrate to a predetermined depth; a first bottom portion located inside the semiconductor substrate; and a first corner portion connecting the first sidewall portion and the first bottom portion. Further, an absolute value $\Delta TB$ of a difference between a thickness of the first insulating film formed on the first corner portion and a thickness of the first insulating film formed on the first bottom portion is smaller than an absolute value $\Delta TA$ of a difference between the thickness of the first insulating film formed on the first corner portion and a thickness of the first insulating film formed on the first sidewall portion.

According to one embodiment, it is possible to improve the reliability of the semiconductor device.

BRIEF DESCRIPTION OF THE DRAWINGS

FIG. 9 is a cross-sectional view showing the manufacturing step subsequent to FIG. 8.

FIG. 10 is a cross-sectional view showing the manufacturing step subsequent to FIG. 9.

DETAILED DESCRIPTION

Figure 1:
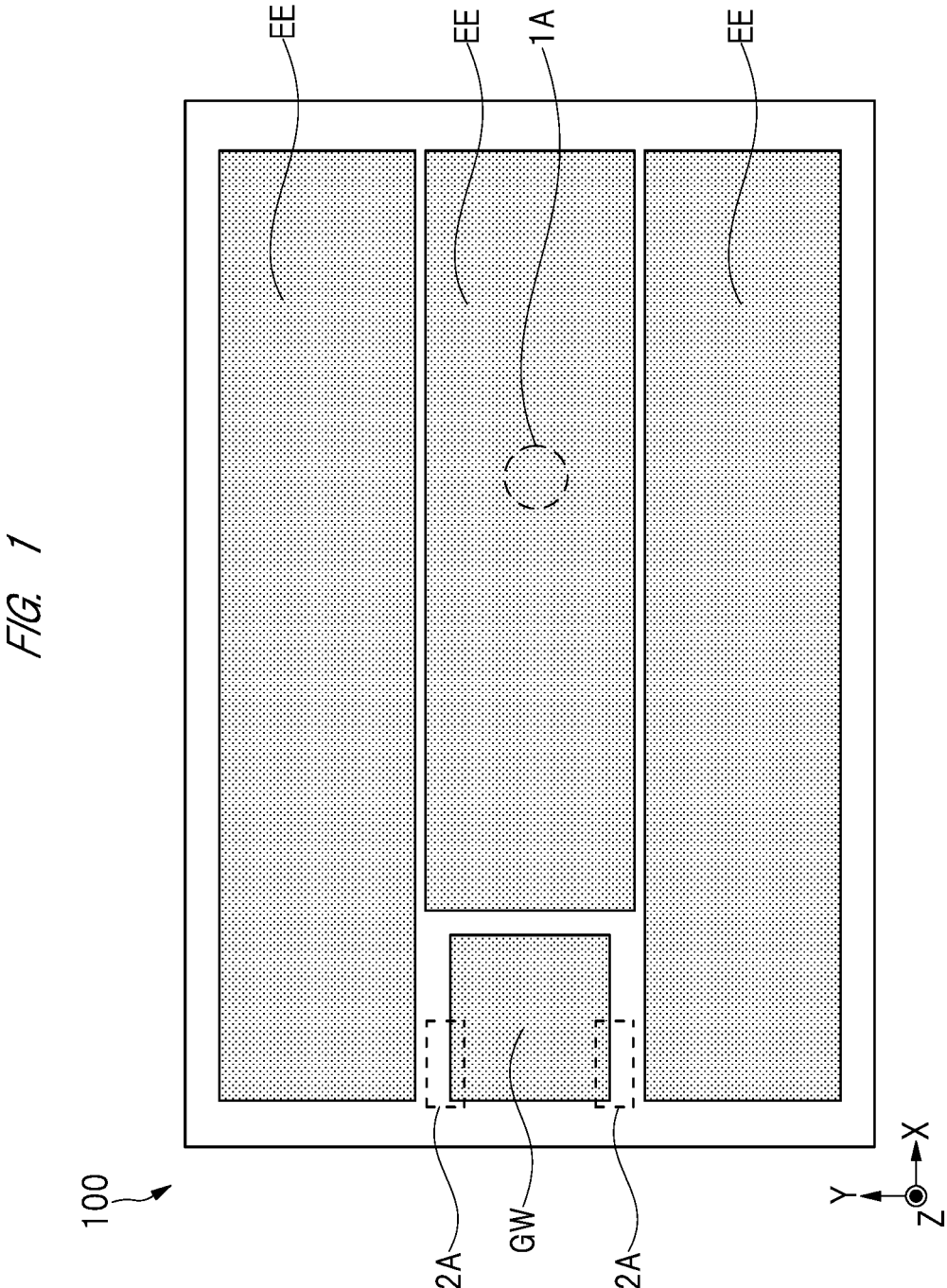
FIG. 1 is a plan view showing a semiconductor device according to the first embodiment.

Hereinafter, embodiments will be described in detail with reference to drawings. In all of the drawings for describing the embodiments, members having the same function are denoted by the same reference characters and the repetitive description thereof will be omitted. Furthermore, in the following embodiments, the description of the same or similar components is not repeated in principle unless particularly necessary.

Also, the X direction, the Y direction, and the Z direction mentioned in this application cross each other and are orthogonal to each other. In the description of this application, the Z direction is defined as a vertical direction, a height direction, or a thickness direction of a certain structure. Further, "plan view" or "in plan view" used in this application means that a plane formed by the X direction and the Y direction is defined as "flat plane" and this "flat plane" is seen in the Z direction.

First Embodiment

<Structure of Semiconductor Device>

The structure of a semiconductor device 100 according to the first embodiment will be described below with reference to FIG. 1 to FIG. 3. The main features of the first embodiment lie in the structure of a trench TR and the thickness of a gate insulating film GI. Such features will be described later in detail with reference to FIG. 12 to FIG. 16. Prior to that, the overall structure of the semiconductor device 100 and the method of manufacturing the same will be described.

FIG. 1 is a plan view showing a semiconductor chip as the semiconductor device 100. As shown in FIG. 1, most of the semiconductor device 100 is covered with emitter electrodes EE. A gate wiring GW is formed in the vicinity of the emitter electrode EE in plan view.

A part of each of the emitter electrode EE and the gate wiring GW is covered with a protective film (not shown). The regions exposed from the protective film are an emitter pad and a gate pad. External connection members such as bonding wires or clips (copper plates) are connected onto the emitter pad and the gate pad, so that the semiconductor device 100 is electrically connected to other chips, a wiring board, and the like.

The semiconductor device 100 has a cell region LA and a resistor region 2A. Main semiconductor elements such as an IGBT are formed in the cell region LA. A resistor element like that formed in the middle of the gate wiring GW is formed in the resistor region 2A.

Figure 2:
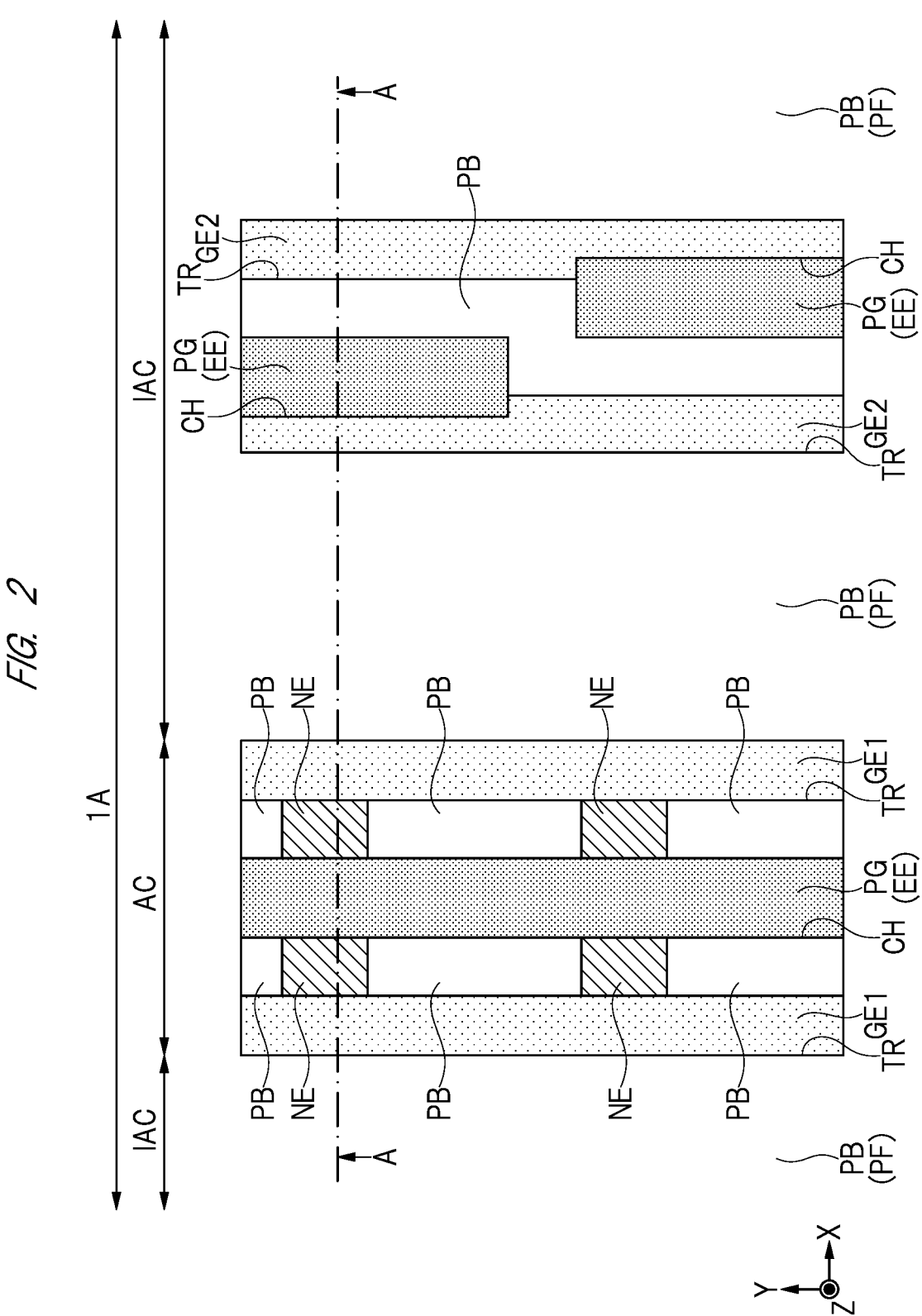
FIG. 2 is a plan view showing the principal part of the semiconductor device according to the first embodiment.

FIG. 2 is a plan view showing the principal part corresponding to the cell region LA shown in FIG. 1. The IGBT shown in FIG. 2 is an IGBT with a GGEE structure, and is an IE-type IGBT that can utilize the IE (Injection Enhancement) effect. The IE effect is a technique for increasing the concentration of charges accumulated in a drift region NV by making it difficult to discharge holes toward the emitter electrode EE when the IGBT is in the ON state. Therefore, the semiconductor device 100 has an active cell AC for performing the main operation of the IGBT and an inactive cell IAC other than the active cell AC.

As shown in FIG. 2, a plurality of trenches TR extends in the Y direction and is next to each other in the X direction. A gate electrode GE1 is formed in the trench TR of the active cell AC. A gate electrode GE2 is formed in the trench TR of the inactive cell IAC. The gate wiring GW is electrically connected to the gate electrode GE1 of the active cell AC, and a gate potential is supplied during the operation of the IGBT. The emitter electrode EE is electrically connected to the gate electrode GE2 of the inactive cell IAC, and an emitter potential is supplied during the operation of the IGBT.

Figure 3:
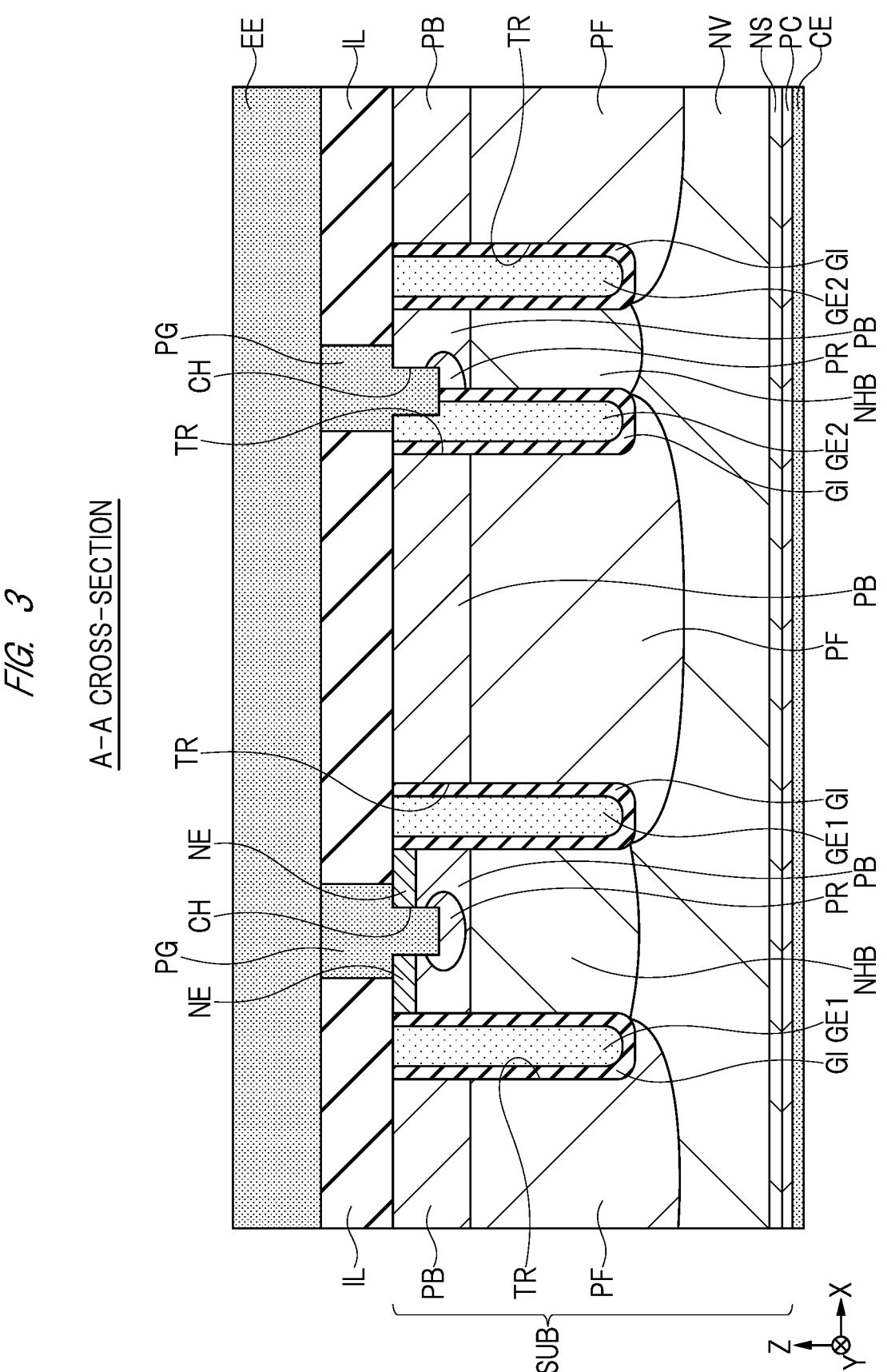
FIG. 3 is a cross-sectional view showing the semiconductor device according to the first embodiment.

FIG. 3 is a cross-sectional view taken along the line A-A shown in FIG. 2. The semiconductor device 100 includes an n-type semiconductor substrate SUB having an upper surface and a lower surface. The semiconductor substrate SUB has an n-type drift region NV. Here, the n-type semiconductor substrate SUB itself constitutes the drift region NV. Note that the drift region NV may be a stacked body of an n-type silicon substrate and a semiconductor layer grown on the silicon substrate by the epitaxial growth method while introducing phosphorus (P). In this application, the description is given assuming that such a stacked body is also the semiconductor substrate SUB.

An n-type field stop region (impurity region) NS is formed in the semiconductor substrate SUB on the lower surface side of the semiconductor substrate SUB. The field stop region NS is provided to prevent a depletion layer extending from a pn junction on the upper surface side of the semiconductor substrate SUB from reaching a p-type collector region PC when the IGBT is turned off.

The p-type collector region (impurity region) PC is formed in the semiconductor substrate SUB on the lower surface side of the semiconductor substrate SUB. The collector region PC is located below the field stop region NS.

A collector electrode CE is formed on the lower surface of the semiconductor substrate SUB. The collector electrode CE is electrically connected to the collector region PC, and supplies a collector potential to the collector region PC. The collector electrode CE is made of a metal film such as an AlSi film, a Ti film, a NiV film, and an Au film.

On the upper surface side of the semiconductor substrate SUB, the trenches TR are formed in the semiconductor substrate SUB. The trench TR penetrates an emitter region NE and a base region PB described later and reaches the semiconductor substrate SUB. The depth of the trench TR is, for example, 2 lam or more and 5 μm or less.

The gate insulating film GI is formed in the trenches TR. The gate electrodes GE1 and GE2 are buried in the trenches TR via the gate insulating film GI. The gate insulating film GI is an insulating film and is, for example, a silicon oxide film. The gate electrodes GE1 and GE2 are conductive films, and are, for example, polycrystalline silicon films into which n-type impurities are introduced. The thickness of the gate insulating film GI is, for example, 70 nm or more and 150 nm or less.

On the upper surface side of the semiconductor substrate SUB of the active cell AC, a hole barrier region (impurity region) NHB is formed in the semiconductor substrate SUB between a pair of the trenches TR (a pair of the gate electrodes GE1). A p-type base region (impurity region) PB is formed in the hole barrier region NHB. An n-type emitter region (impurity region) NE is formed in the p-type base region PB. The base region PB is formed so as to be shallower than the trench TR, and the emitter region NE is formed so as to be shallower than the base region PB.

On the upper surface side of the semiconductor substrate SUB of the inactive cell IAC, a hole barrier region NHB is formed in the semiconductor substrate SUB between a pair of the trenches TR (a pair of the gate electrodes GE2). Also, a p-type floating region (impurity region) PF is formed in the semiconductor substrate SUB between the gate electrode GE1 and the gate electrode GE2. A p-type base region PB is formed in each of the hole barrier region NHB and the floating region PF. The floating region PF is preferably formed to a position deeper than the bottom portions of the trenches TR in order to enhance the high withstand voltage characteristics, and is more preferably formed so as to cover the bottom portions of the trenches TR.

An interlayer insulating film IL is formed on the upper surface of the semiconductor substrate SUB. The interlayer insulating film IL is, for example, a silicon oxide film. Note that the interlayer insulating film IL may be a stacked film of a silicon oxide film and a silicon oxide film containing boron and phosphorus (BPSG: Boro Phospho Silicate Glass). The thickness of the interlayer insulating film IL is, for example, 600 nm or more and 1500 nm or less.

In the active cell AC, a contact hole CH penetrates the interlayer insulating film IL and the emitter region NE, and reaches the base region PB. The contact hole CH is formed so as to be in contact with the emitter region NE and the base region PB.

The interlayer insulating film IL is recessed above the contact hole CH. In other words, the size of the opening of the contact hole CH located above the upper surface of the semiconductor substrate SUB is larger than the size of opening of the contact hole CH located below the upper surface of the semiconductor substrate SUB. Therefore, a part of the upper surface of the emitter region NE is exposed from the interlayer insulating film IL. Consequently, inside the contact hole CH, the emitter electrode EE comes into contact with not only the side surface of the emitter region NE but also a part of the upper surface of the emitter region NE. Thereby, the contact resistance between the emitter electrode EE and the emitter region NE can be reduced.

In the inactive cell IAC, the contact hole CH penetrates the interlayer insulating film IL and reaches the base region PB. Further, the contact hole CH is formed so as to overlap with the gate electrode GE2 in plan view. Therefore, the contact hole CH in the inactive cell IAC is formed so as to be in contact with the gate electrode GE2 and the base region PB.

In each of the active cell AC and the inactive cell IAC, a p-type high-concentration diffusion region (impurity region) PR is formed in the base region PB around the bottom portion of the contact hole CH. The high-concentration diffusion region PR is provided to reduce contact resistance with the emitter electrode EE and to prevent latch-up.

A plug PG is buried in the contact hole CH. The plug PG includes a barrier metal film and a conductive film formed on the barrier metal film. The barrier metal film is, for example, a stacked film of a titanium film and a titanium nitride film formed on the titanium film. The conductive film is, for example, a tungsten film.

Although not shown here, the contact hole CH is formed also on a part of the gate electrode GE1, and the plug PG is formed also in this contact hole CH.

The emitter electrode EE is formed on the interlayer insulating film IL. The emitter electrode EE is electrically connected to the emitter region NE, the base region PB, the high-concentration diffusion region PR, and the gate electrode GE2 via the plugs PG, and supplies an emitter potential to these regions.

Although not shown here, the gate wiring GW formed in the same process as the emitter electrode EE is also formed on the interlayer insulating film IL. The gate wiring GW is electrically connected to the gate electrode GE1 via the plug PG, and supplies a gate potential to the gate electrode GE1. Such emitter electrode EE and gate wiring GW are formed of, for example, a TiW film and an aluminum film formed on the TiW film. The aluminum film is a main conductor film of the emitter electrode EE and the gate wiring GW, and is sufficiently thicker than the TiW film.

Examples of the impurity concentration of the respective impurity regions are shown below. The impurity concentration of the drift region NV is $1 \times 10^{13}$ cm$^{-3}$ or more and $2 \times 10^{14}$ cm$^{-3}$ or less. The impurity concentration of the field stop region NS is higher than that of the drift region NV, and is $5 \times 10^{16}$ cm$^{-3}$ or more and $5 \times 10^{17}$ cm$^{-3}$ or less. The impurity concentration of the hole barrier region NHB is higher than that of the drift region NV, and is $1 \times 10^{16}$ cm$^{-3}$ or more and $1 \times 10^{17}$ cm$^{-3}$ or less. The impurity concentration of the emitter region NE is higher than that of the hole barrier region NHB, and is $1 \times 10^{18}$ cm$^{-3}$ or more and $1 \times 10^{21}$ cm$^{-3}$ or less. The impurity concentration of the collector region PC is $1 \times 10^{17}$ cm$^{-3}$ or more and $1 \times 10^{21}$ cm$^{-3}$ or less. The impurity concentration of the floating region PF is $1 \times 10^{15}$ cm$^{-3}$ or more and $1 \times 10^{16}$ cm$^{-3}$ or less. The impurity concentration of the base region PB is higher than that of the floating region PF, and is $1 \times 10^{16}$ cm$^{-3}$ or more and $1 \times 10^{18}$ cm$^{-3}$ or less. The impurity concentration of the high-concentration diffusion region PR is higher than that of the base region PB, and is $1 \times 10^{18}$ cm$^{-3}$ or more and $1 \times 10^{21}$ cm$^{-3}$ or less.

<Method of Manufacturing Semiconductor Device>

A method of manufacturing the semiconductor device 100 according to the first embodiment will be described below with reference to FIG. 4 to FIG. 11.

Figure 4:
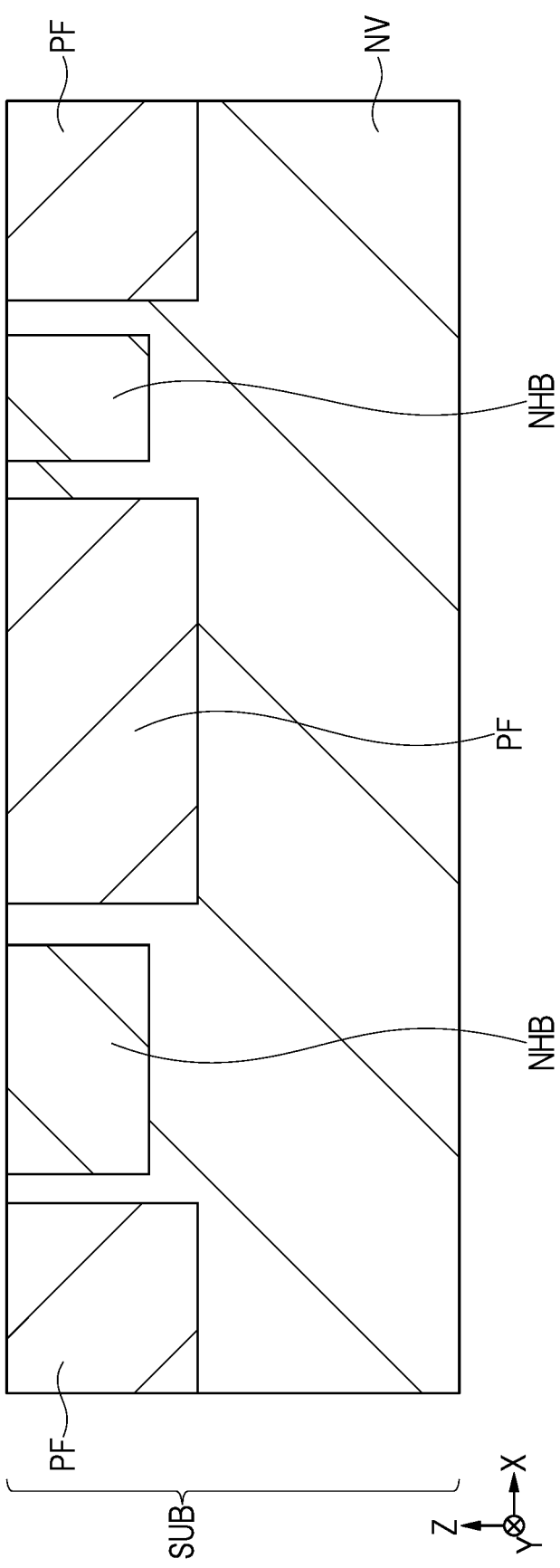
FIG. 4 is a cross-sectional view showing a manufacturing step of the semiconductor device according to the first embodiment.

As shown in FIG. 4, first, the n-type semiconductor substrate SUB having an upper surface and a lower surface is prepared. The semiconductor substrate SUB has the n-type drift region IV. Next, on the upper surface side of the semiconductor substrate SUB, the n-type hole barrier region NHB and the p-type floating region PF are formed in the semiconductor substrate SUB by the photolithography technique and the ion implantation method.

Figure 5:
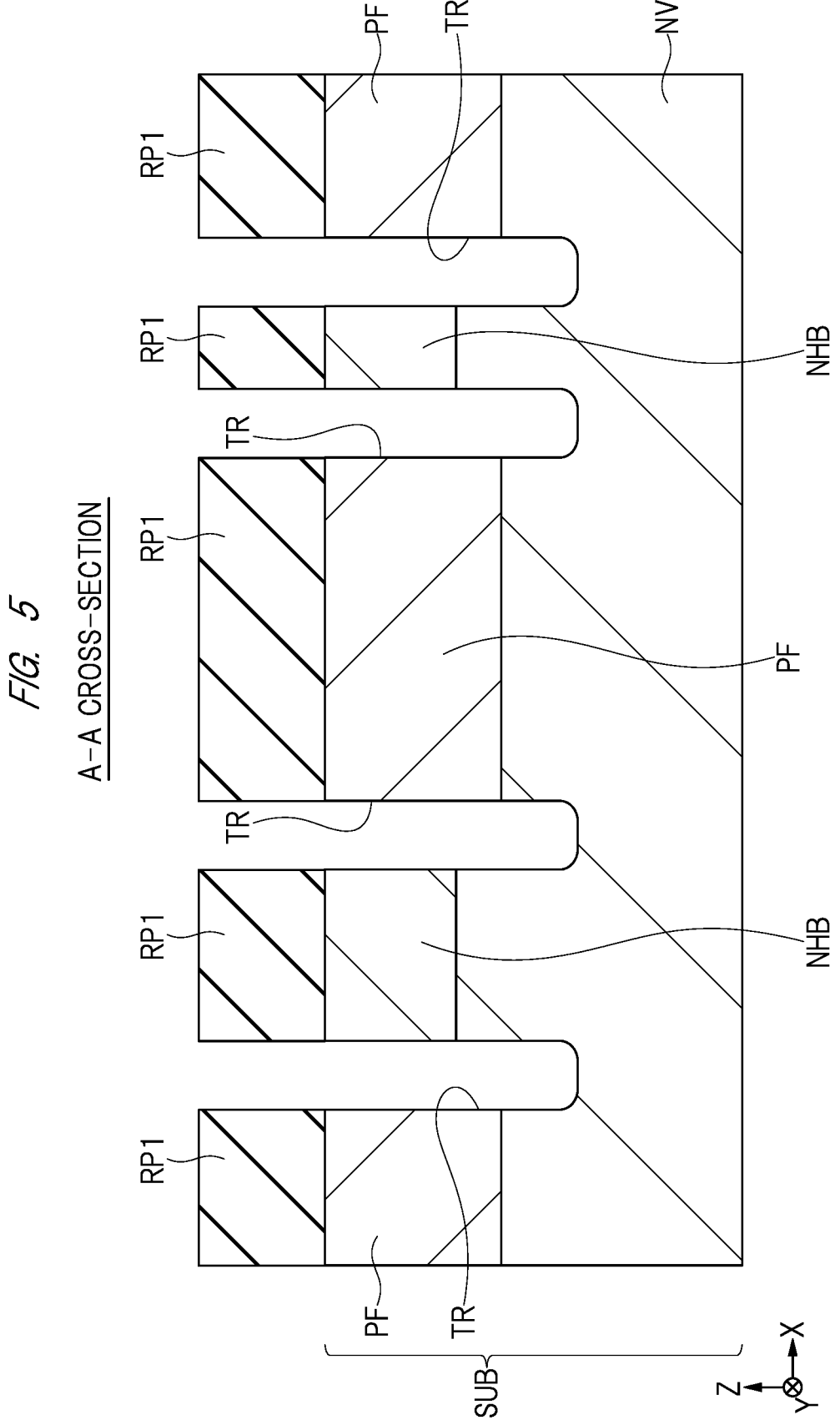
FIG. 5 is a cross-sectional view showing the manufacturing step subsequent to FIG. 4.

As shown in FIG. 5, on the upper surface side of the semiconductor substrate SUB, the trenches TR are formed in the semiconductor substrate SUB. First, a resist pattern RP1 is formed on the upper surface of the semiconductor substrate SUB. Next, the dry etching process using $C_4F_8$ gas and $SF_6$ gas is performed on the semiconductor substrate SUB with the resist pattern RP1 used as a mask, thereby forming the trenches TR in the semiconductor substrate SUB. Thereafter, the resist pattern RP1 is removed by the asking process.

Figure 6:
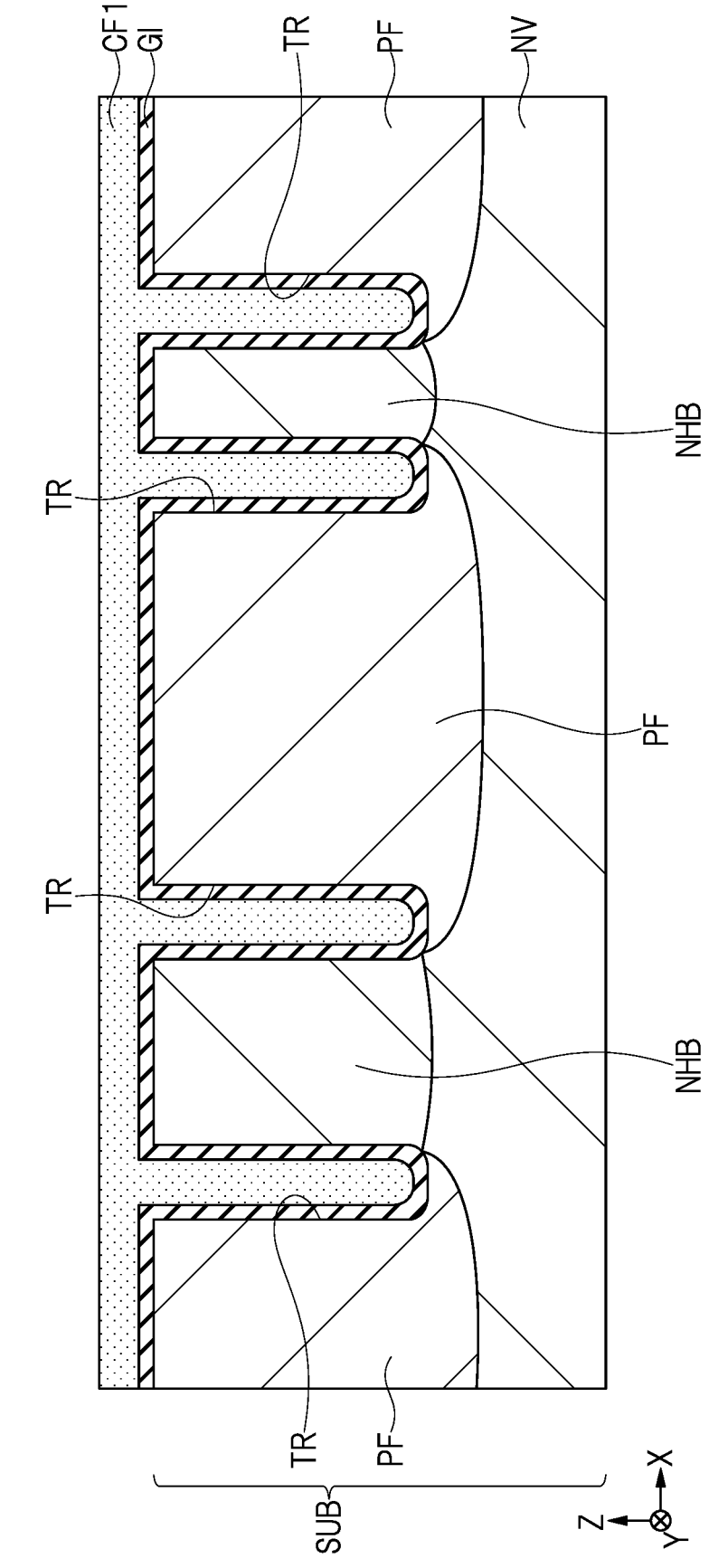
FIG. 6 is a cross-sectional view showing the manufacturing step subsequent to FIG. 5.

As shown in FIG. 6, first, the semiconductor substrate SUB is subjected to heat treatment at, for example, 1000° C. or higher and 1200° C. or lower, thereby diffusing the impurities contained in the hole barrier region NHB and the floating region PF. By this heat treatment, the hole barrier region NHB is diffused to the vicinity of the bottom portion of the trench TR, and the floating region PF is diffused to a position deeper than the bottom portion of the trench TR so as to cover the bottom portion of the trench TR.

Next, the gate insulating film GI is formed in the trenches TR and on the semiconductor substrate SUB. The gate insulating film GI is formed by performing a thermal oxidation process using water vapor under the condition of 900° C. or higher and 1000° C. or lower. Next, the conductive film CF1 is formed by, for example, the CVD method so as to fill the inside of the trenches TR via the gate insulating film GI. The conductive film CF1 is, for example, a polycrystalline silicon film into which n-type impurities are introduced.

Figure 7:
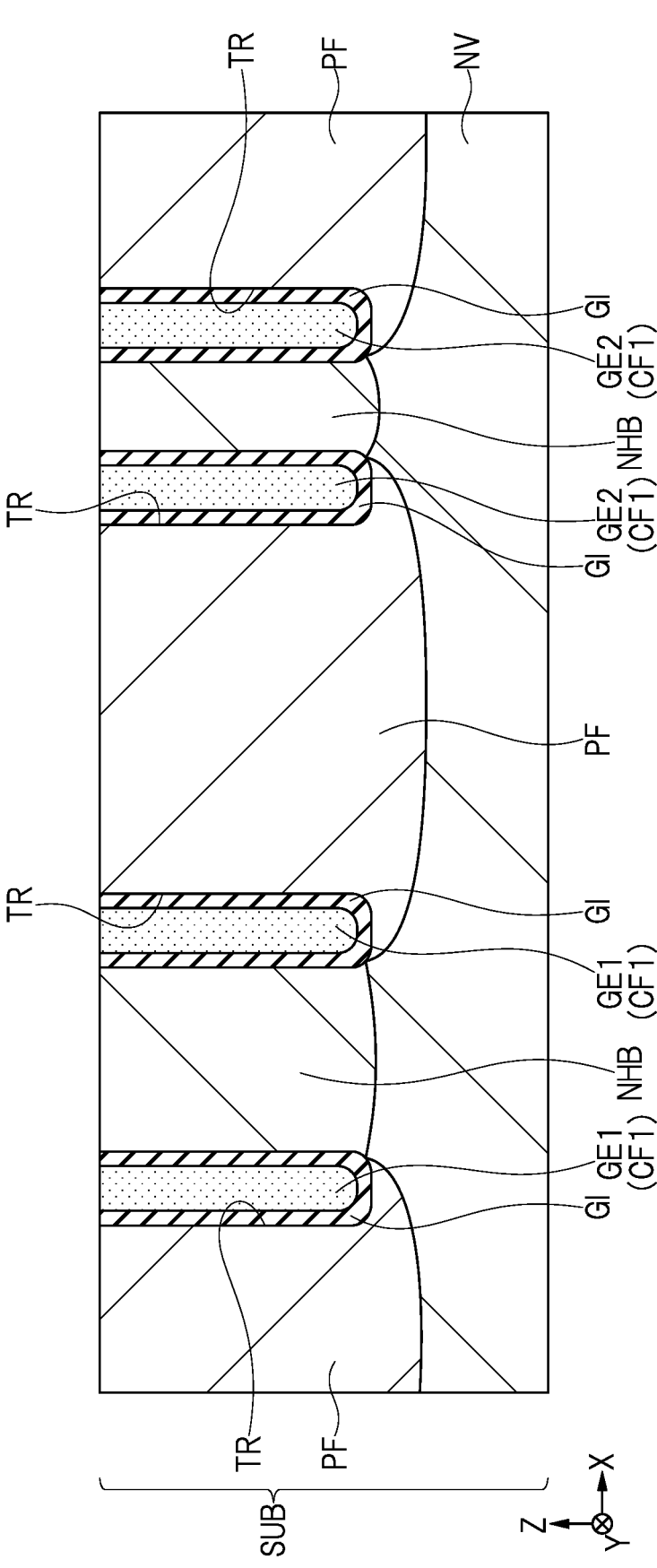
FIG. 7 is a cross-sectional view showing the manufacturing step subsequent to FIG. 6.

As shown in FIG. 7, first, the conductive film CF1 formed outside the trenches TR is removed by the dry etching process. The conductive film CF1 formed inside the trenches TR is left as the gate electrodes GE1 and GE2. Next, the gate insulating film GI formed outside the trenches TR is removed by the isotropic etching process.

Figure 8:
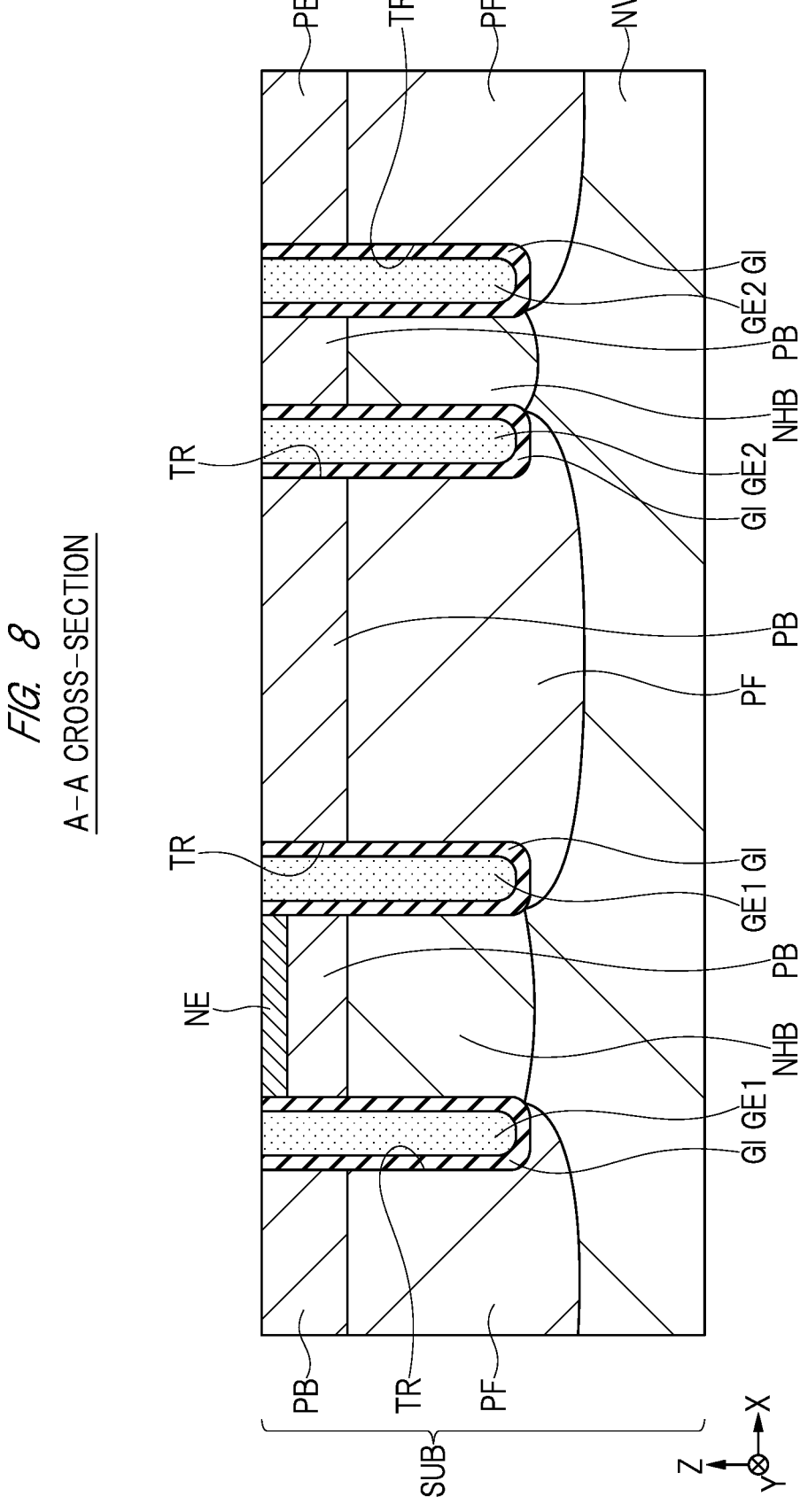
FIG. 8 is a cross-sectional view showing the manufacturing step subsequent to FIG. 7.

As shown in FIG. 8, on the upper surface side of the semiconductor substrate SUB, the p-type base region PB is formed in the semiconductor substrate SUB (floating region PF and hole barrier region NHB) by the photolithography technique and the ion implantation method. Next, the n-type emitter region NE is selectively formed in the base region PB of the active cell AC by the photolithography technique and the ion implantation method.

Though not shown, an insulating film such as a silicon oxide film may be formed on the upper surface of the semiconductor substrate before these ion implantations, and the ion implantation using the insulating film as a through film may be performed. Further, the through film may be removed after the ion implantation or may be left as a part of the interlayer insulating film IL.

Figure 9:
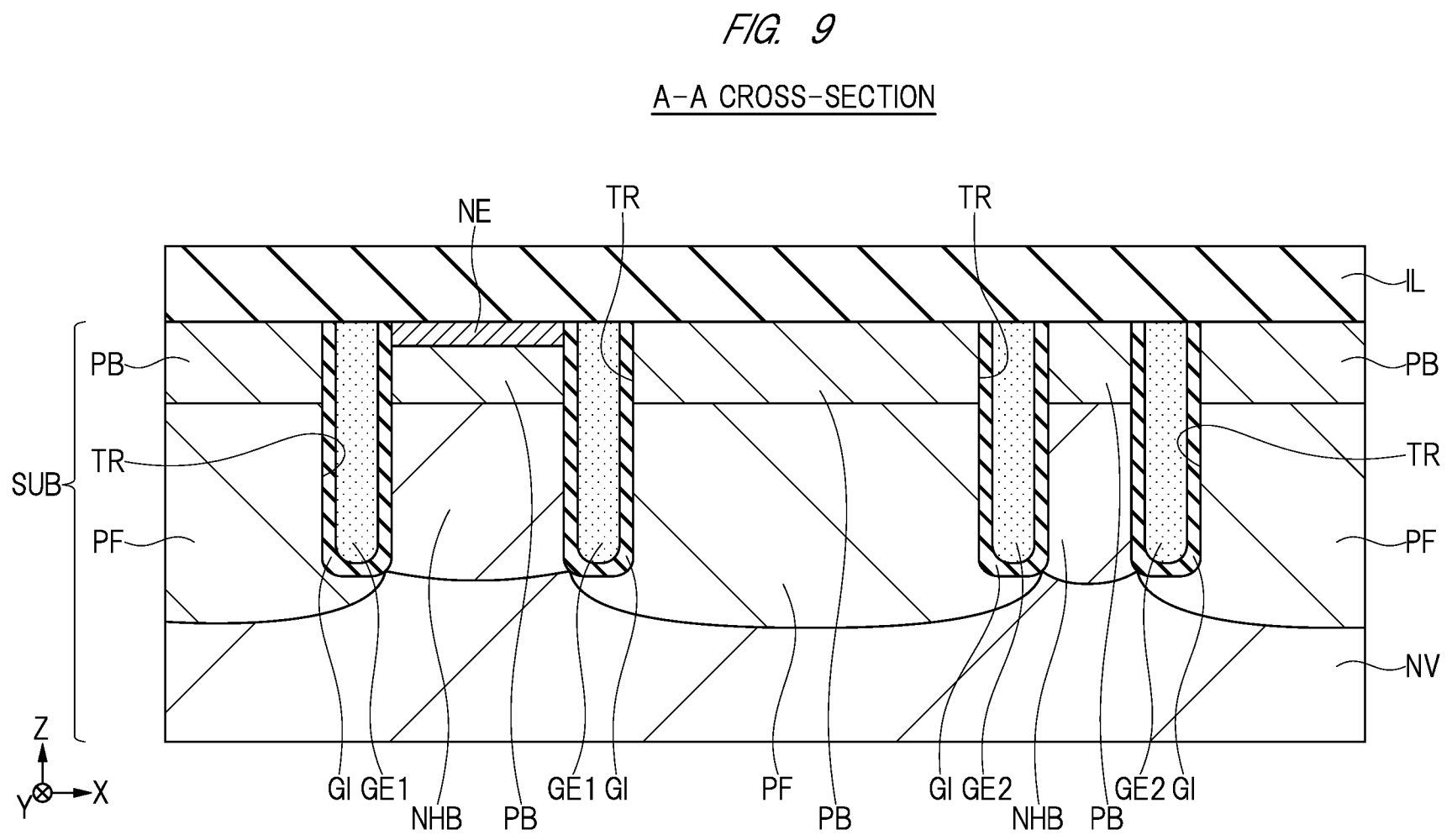

As shown in FIG. 9, the interlayer insulating film IL is formed on the upper surface of the semiconductor substrate SUB by, for example, the CVD method so as to cover the trenches TR. The interlayer insulating film IL is, for example, a silicon oxide film. Note that the interlayer insulating film IL may be, for example, a stacked film of a silicon oxide film formed by the CVD method and a BPSG film formed by the coating method.

Figure 10:
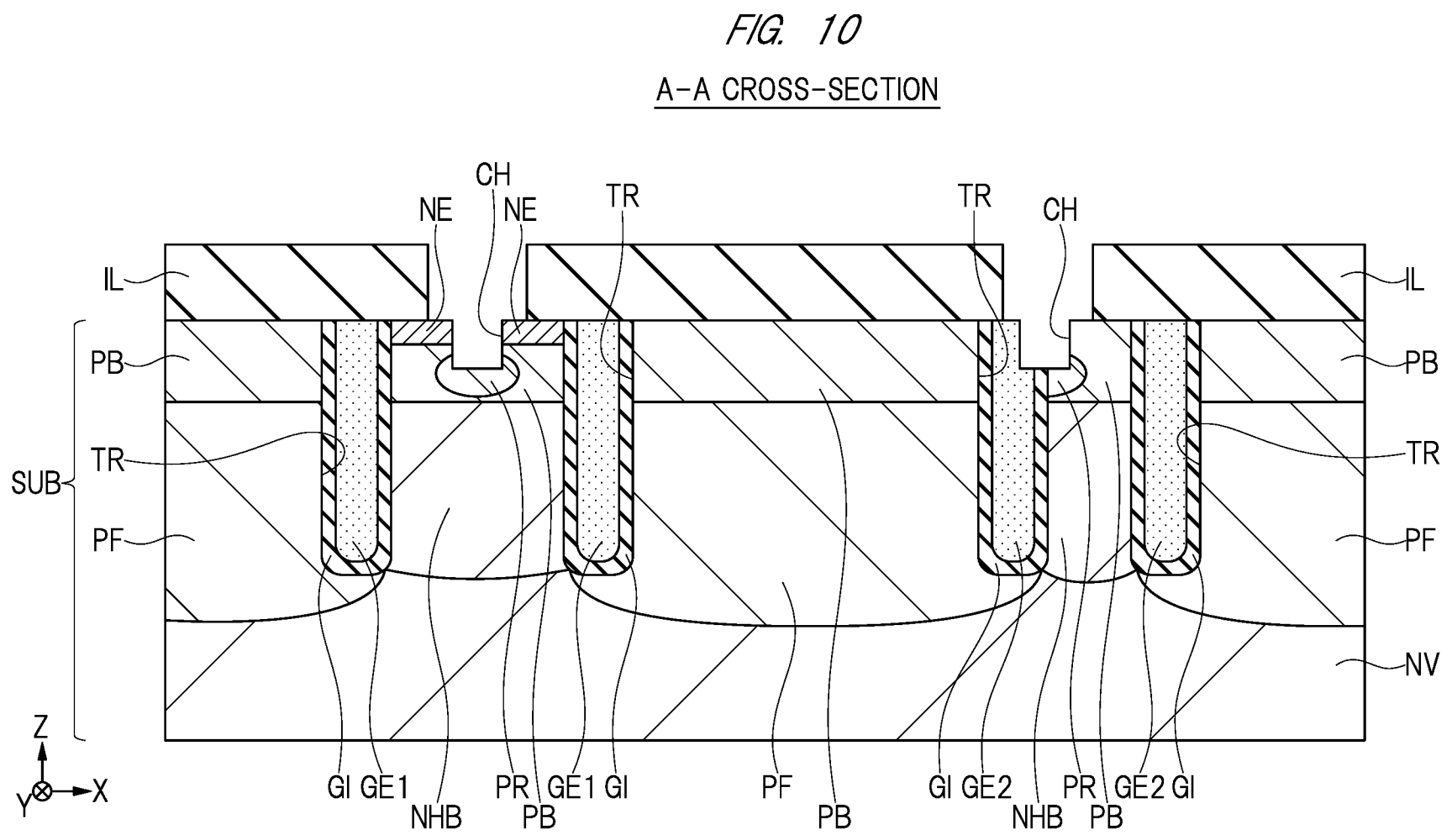

As shown in FIG. 10, in the active cell AC, the contact holes CH are formed in the interlayer insulating film IL, the emitter region EE, and the base region PB by the photolithography technique and the dry etching process. The bottom portion of the contact hole CH is located in the base region PB.

Here, the contact hole CH is formed also in the inactive cell IAC, and this contact hole CH is formed so as to overlap with the gate electrode GE2 in plan view. Therefore, the contact hole CH in the inactive cell IAC is formed so as to be in contact with the gate electrode GE2 and the base region PB. Though not shown, the contact hole CH is formed also on a part of the gate electrode GE1.

Next, the p-type high-concentration diffusion region PR is formed in the base region PB at the bottom portion of the contact hole CH by the photolithography technique and the ion implantation method. Then, the interlayer insulating film IL is recessed by performing the isotropic etching process to the interlayer insulating film IL. For example, an aqueous solution containing, for example, hydrofluoric acid is used for this isotropic etching process. Thereby, the width of the opening of the contact hole CH located on the upper surface of the semiconductor substrate SUB becomes larger than the width of the opening of the contact hole CH located inside the semiconductor substrate SUB. Note that the amount of recession of the interlayer insulating film IL by the isotropic etching process is 60 nm or more and 130 nm or less.

Figure 11:
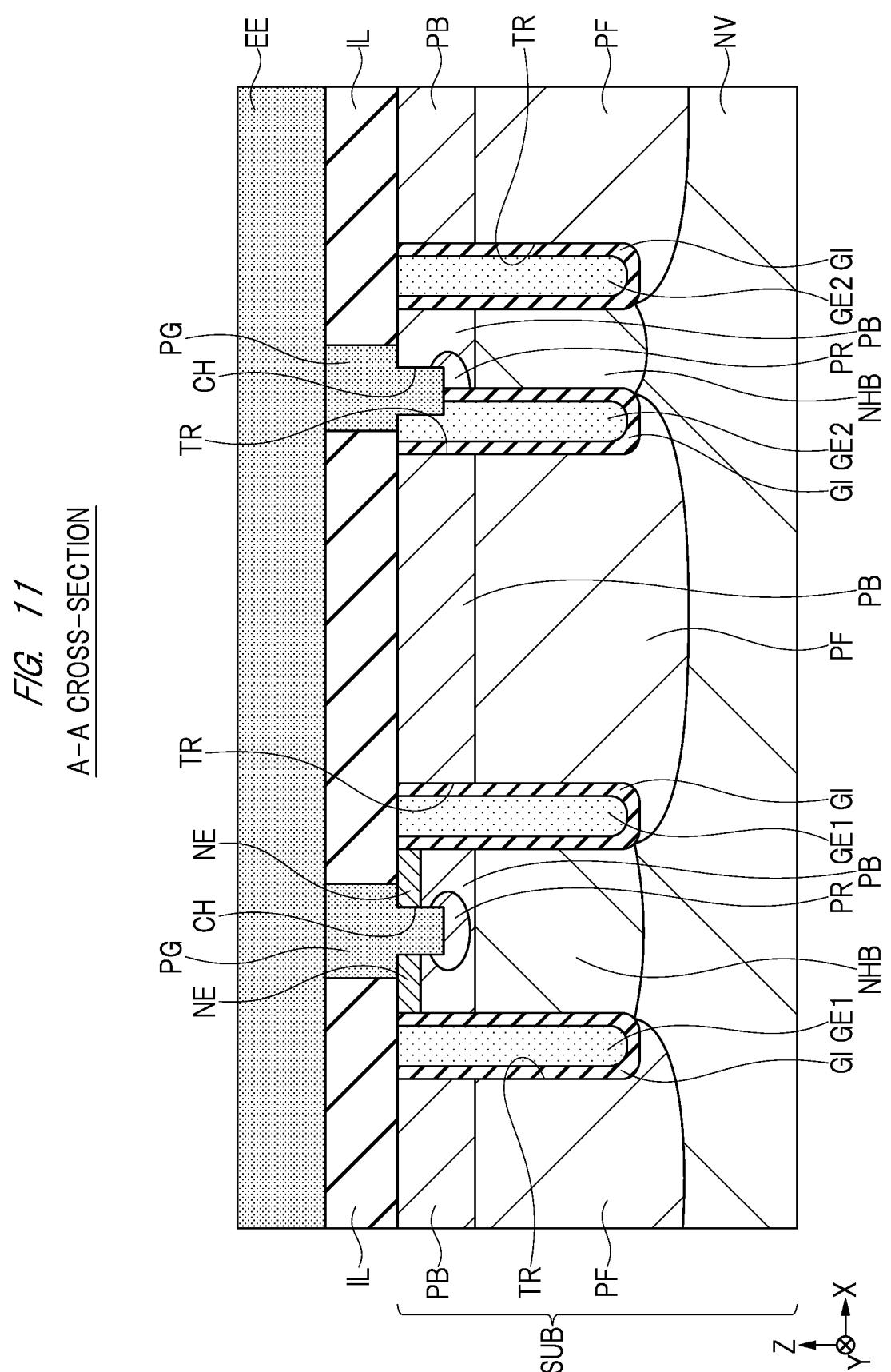
FIG. 11 is a cross-sectional view showing the manufacturing step subsequent to FIG. 10.

As shown in FIG. 11, the emitter electrode EE is formed on the interlayer insulating film IL so as to fill the inside of the contact holes CH. First, a TiW film is formed on the interlayer insulating film IL by, for example, the sputtering method, and an aluminum film is formed on the TiW film by, for example, the sputtering method. Next, the TiW film and the aluminum film are patterned by the photolithography technique and the dry etching process, thereby forming the emitter electrode EE. Though not shown here, the gate wiring GW is also formed on the interlayer insulating film IL in the same step as the step of forming the emitter electrode EE.

Thereafter, the structure shown in FIG. 3 is obtained through the following manufacturing steps. First, the n-type field stop region NS and the p-type collector region PC are formed by performing the ion implantation from the lower surface side of the semiconductor substrate SUB. After these ion implantations, laser annealing is performed to activate the impurities contained in the field stop region NS and the collector region PC. Next, a metal film such as an AlSi film, a Ti film, a NiV film, and an Au film is formed on the lower surface of the semiconductor substrate SUB by, for example, the sputtering method. This metal film serves as the collector electrode CE.

Main Features of First Embodiment

Figure 20:
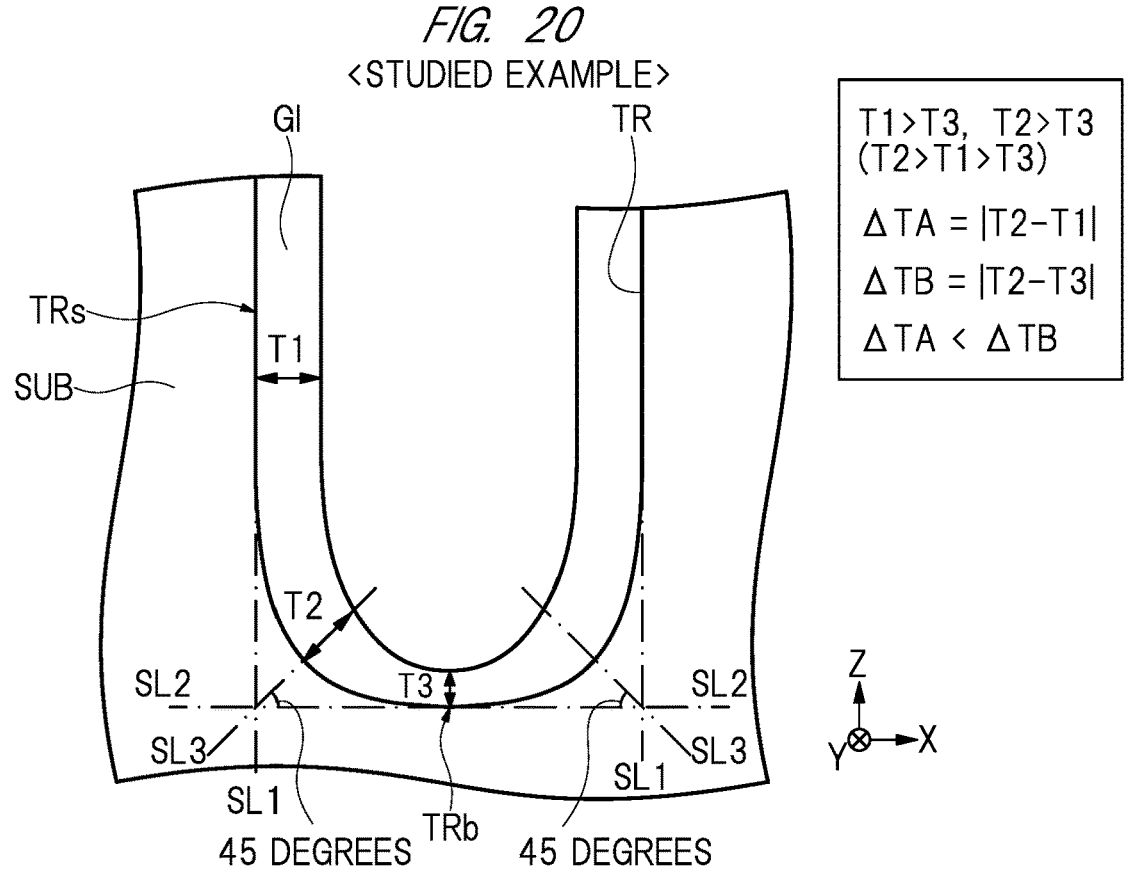
FIG. 20 is an enlarged cross-sectional view showing a semiconductor device according to the studied example.
Figure 21:
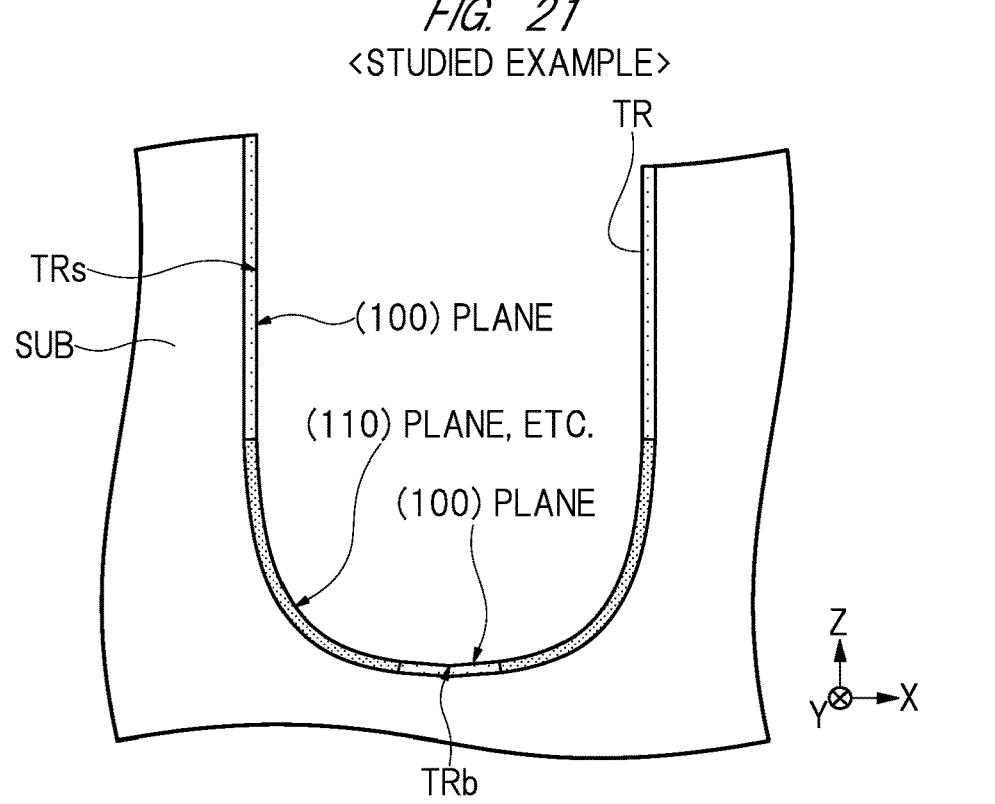
FIG. 21 is an enlarged cross-sectional view showing the semiconductor device according to the studied example.
Figure 22:
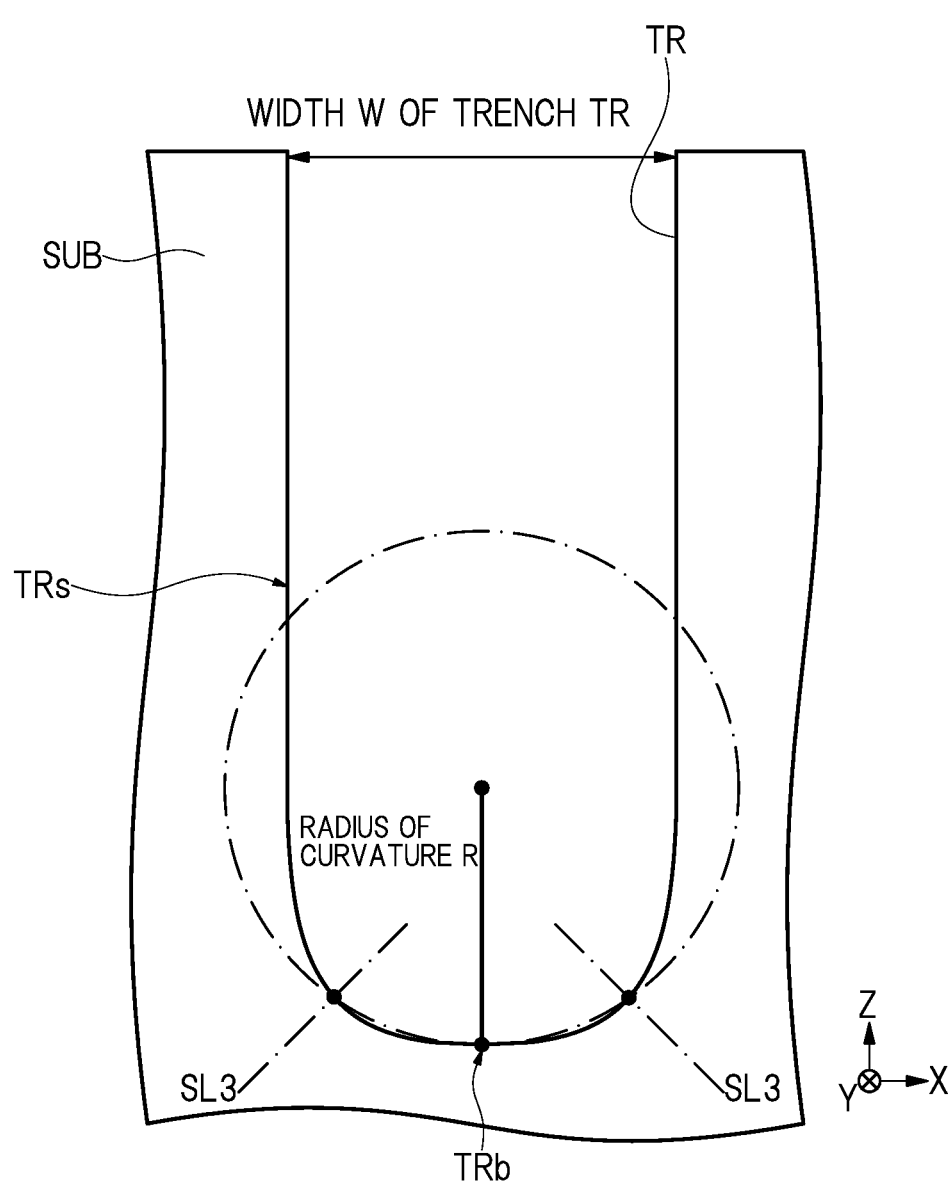
FIG. 22 is an enlarged cross-sectional view showing the semiconductor device according to the studied example.

Main features of the first embodiment will be described below with reference to FIG. 12 to FIG. 16. Also, as a comparison with the first embodiment, the studied example in FIG. 20 to FIG. 22 is used. The studied example is a semiconductor device studied by the inventors of this application based on Patent Document 1 and the like.

Figure 12:
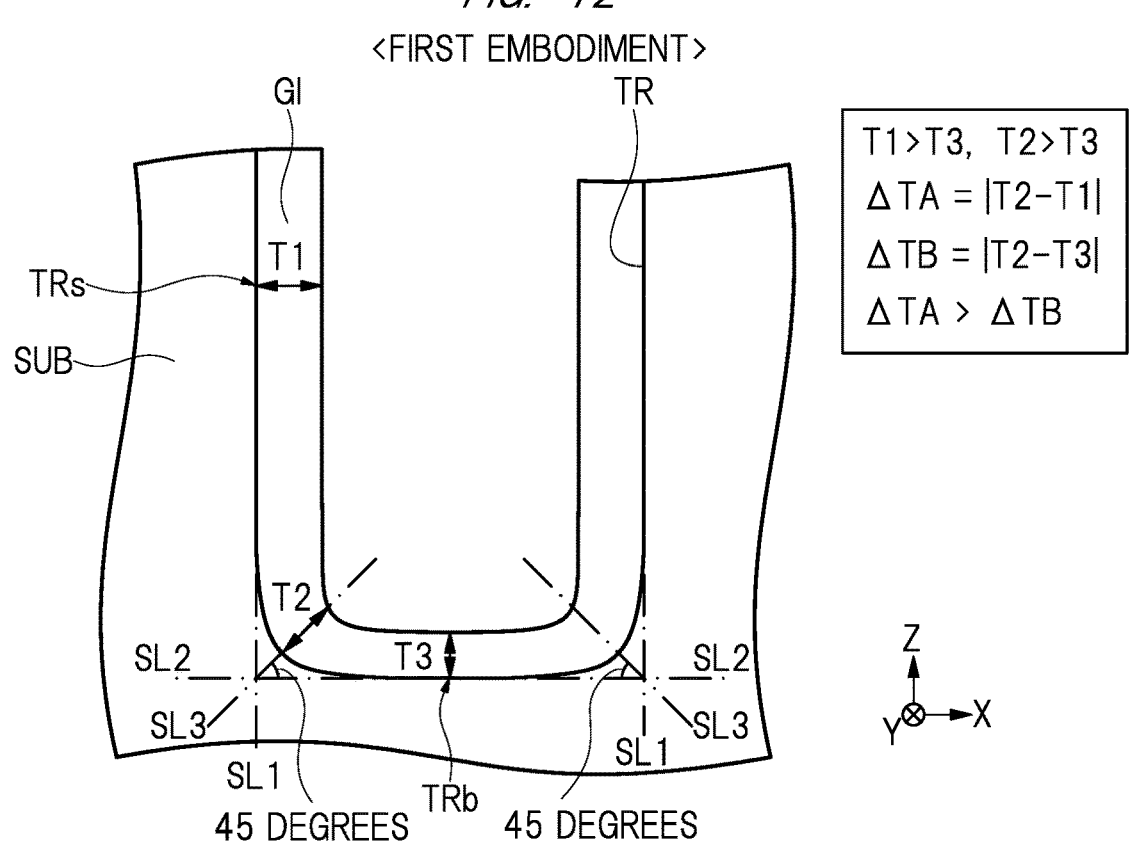
FIG. 12 is an enlarged cross-sectional view showing the semiconductor device according to the first embodiment.

As shown in FIG. 12, the trench TR has sidewall portions, a bottom portion, and corner portions connecting the sidewall portions and the bottom portion. The bottom portion includes a deepest portion TRb which is located inside the semiconductor substrate SUB and whose depth from the upper surface of the semiconductor substrate SUB is the largest. The sidewall portion includes an intermediate portion TRs which is formed from the upper surface of the semiconductor substrate SUB toward the inside of the semiconductor substrate to a predetermined depth and is located at half the depth from the upper surface of the semiconductor substrate SUB to the deepest portion TRb.

The corner portion includes a portion through which a straight line SL3, which extends from an intersecting point between a first straight line SL1 as a tangent line of the intermediate portion TRs and a second straight line SL2 as a tangent line of the deepest portion TRb in a direction inclined by 45 degrees from the second straight line SL2 toward the first straight line SL1, passes.

In FIG. 12, the thickness of the gate insulating film GI formed on the sidewall portion is illustrated as a thickness T1, the thickness of the gate insulating film GI formed on the corner portion is illustrated as a thickness T2, and the thickness of the gate insulating film GI formed on the bottom portion is illustrated as a thickness T3. Note that the thickness Ti is the thickness of the gate insulating film GI at the intermediate portion TRs. Also, the thickness T2 is the thickness of the gate insulating film GI on the third straight line SL3. Further, the thickness T3 is the thickness of the gate insulating film GI at the deepest portion TRb.

In the first embodiment, the thickness Ti and the thickness T2 are each larger than the thickness T3. More specifically, the thickness Ti is larger than the thickness T2, and the thickness T2 is larger than the thickness T3. Further, the absolute value $\Delta$TB of the difference between the thickness T2 and the thickness T3 is smaller than the absolute value $\Delta$TA of the difference between the thickness T2 and the thickness T1.

On the other hand, in the studied example, as shown in FIG. 20, the magnitude relationship between the thickness Ti and the thickness T3 and the magnitude relationship between the thickness T2 and the thickness T3 are the same as those of the first embodiment, but the absolute value ΔTB of the difference between the thickness T2 and the thickness T3 is larger than the absolute value ΔTA of the difference between the thickness T2 and the thickness T1. Moreover, in the studied example, there is the case (worst case) where the thickness T2 is larger than the thickness Ti and the thickness Ti is larger than the thickness T3.

In the studied example, the trench TR has a round shape in the vicinity of the bottom portion. The dry etching process using $SF_6$ gas is performed to form the trench TR in the studied example. Since the $SF_6$ gas has a high isotropic etching component, the shape in the vicinity of the bottom portion tends to be rounded. Even when mixed gas containing $Cl_2$ gas and $O_2$ gas is used instead of $SF_6$ gas, the shape in the vicinity of the bottom portion can be rounded by increasing the processing pressure.

By performing the dry etching process like this, in the studied example, as shown in FIG. 21, the crystal plane of the semiconductor substrate SUB at the sidewall portion and the bottom portion of the trench TR becomes the (100) plane, but the crystal plane of the semiconductor substrate SUB at a part of the sidewall portion and a part of the bottom portion located around the corner portion becomes the crystal plane other than the (100) plane, such as the (110) plane.

When the thermal oxidation process is performed on the (110) plane or the like, the thickness of the gate insulating film GI becomes larger as compared with the case where the thermal oxidation process is performed on the (100) plane. Accordingly, in the studied example, as in the worst case described above, the thickness T2 of the gate insulating film GI around the corner portion is likely to be the largest in the trench TR. Therefore, the thickness of the gate insulating film GI tends to vary in the vicinity of the bottom portion of the trench TR, which causes the problem that the portion locally having a low withstand voltage is formed.

In the first embodiment, the trench TR has a flat shape in the vicinity of the bottom portion. The dry etching process using $C_4F_8$ gas and $SF_6$ gas is performed to form the trench TR in the first embodiment. Referring to FIG. 5, a deposition film is deposited on the upper and side surfaces of the resist pattern RP1 and the upper surface of the semiconductor substrate SUB by performing a first plasma process using $C_4F_8$ gas. Next, by performing a high-voltage second plasma process using $SF_6$ gas, the deposition film is left on the side surfaces of the resist pattern RP1. Then, by performing a third plasma process using $SF_6$ gas at a voltage lower than that of the second plasma process, the semiconductor substrate SUB exposed from the resist pattern RP1 and the deposition film is etched. The dry etching process including the first plasma process, the second plasma process, and the third plasma process is defined as one cycle, and the dry etching process is repeated in a plurality of cycles, whereby the flat-shaped trenches TR of the first embodiment are formed.

Figure 13:
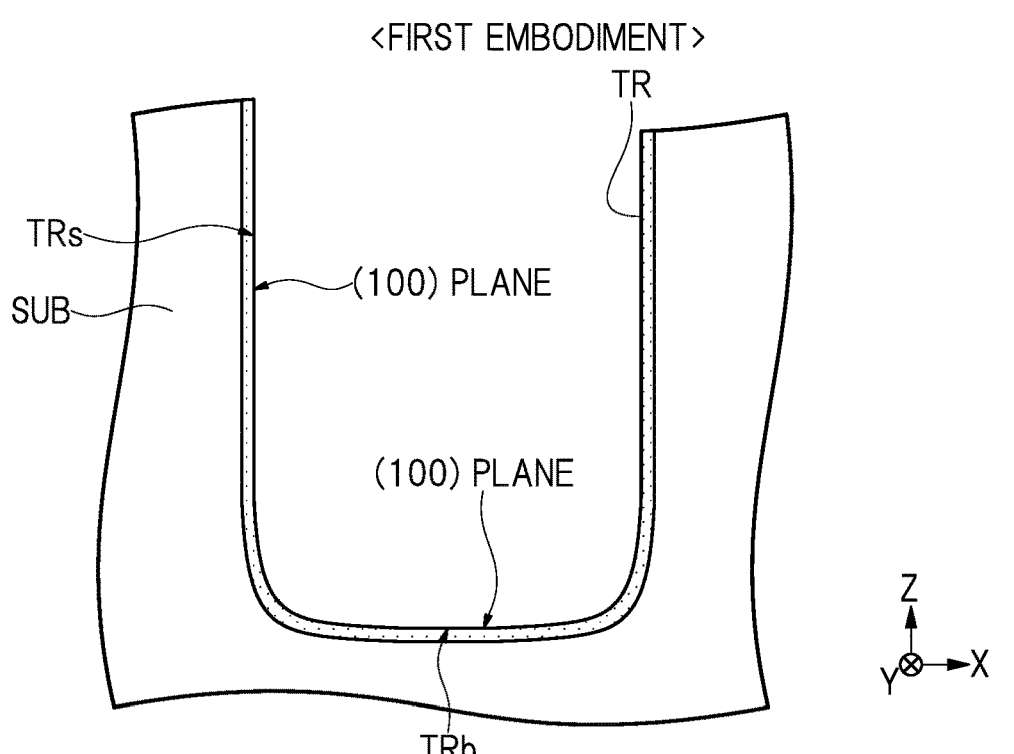
FIG. 13 is an enlarged cross-sectional view showing the semiconductor device according to the first embodiment.

As shown in FIG. 13, in the flat-shaped trench TR, the occurrence of the crystal plane other than the (100) plane is suppressed, and thus the crystal plane of the semiconductor substrate SUB at each of the sidewall portion, the corner portion, and the bottom portion of the trench TR is the (100) plane. Therefore, the thickness T3 on the bottom portion approaches the thickness T2 on the corner portion. Accordingly, the absolute value ΔTB of the difference between the thickness T2 on the corner portion and the thickness T3 on the bottom portion is smaller than the absolute value ΔTA of the difference between the thickness T2 on the corner portion and the thickness Ti on the sidewall portion, contrary to the relationship in the studied example. In other words, since the uniformity of the thickness of the gate insulating film GI is enhanced in the vicinity of the bottom portion of the trench TR, the portion locally having a low withstand voltage is less likely to be formed. Thus, according to the first embodiment, reliability of the semiconductor device 100 can be improved.

Note that the flat-shaped trench TR and the round-shaped trench TR can be distinguished as follows. In the flat-shaped trench TR, the crystal plane of the semiconductor substrate SUB can be the (100) plane in the entire trench TR, and the uniformity of the thickness of the gate insulating film GI can be enhanced.

Figure 14:
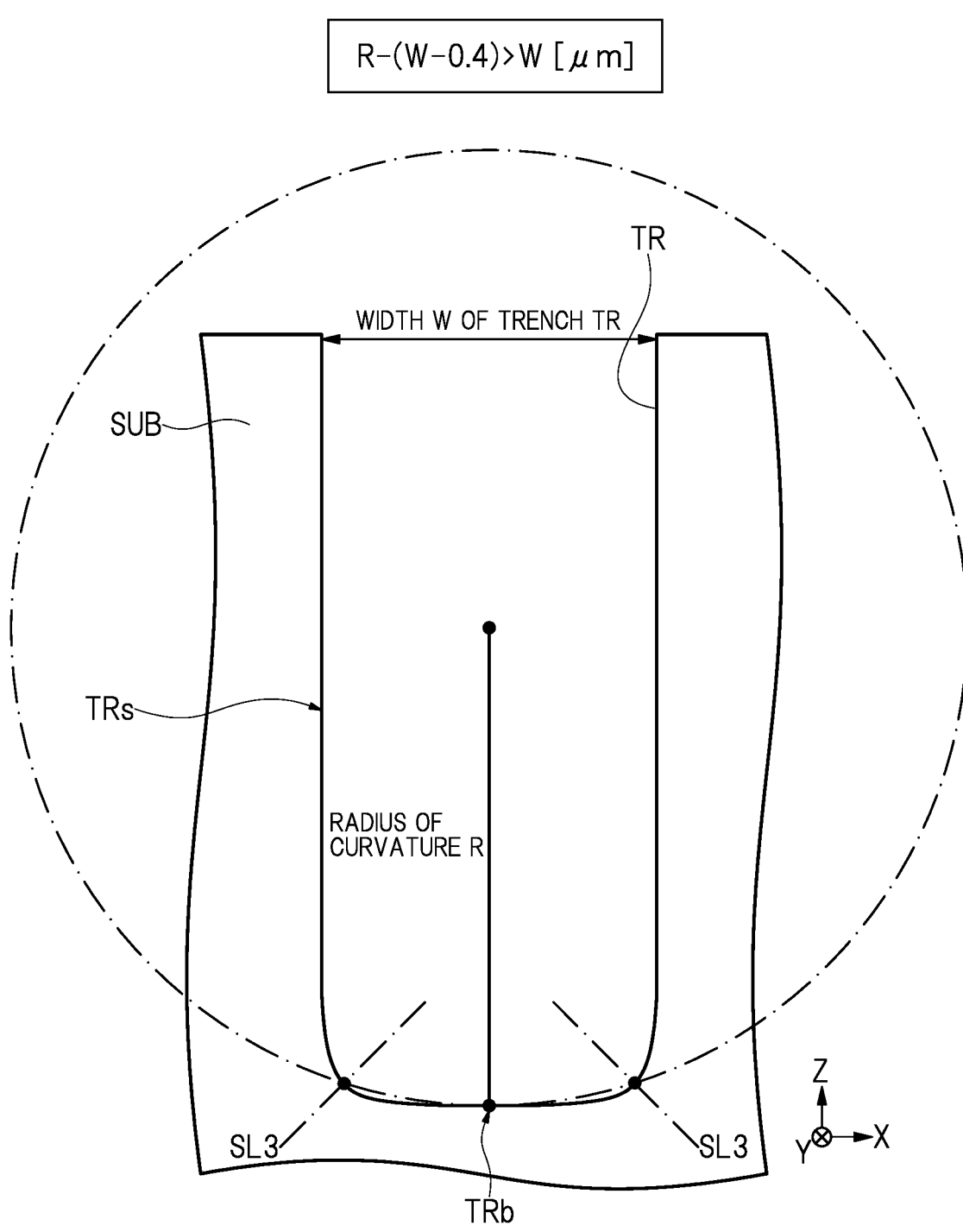
FIG. 14 is an enlarged cross-sectional view showing the semiconductor device according to the first embodiment.

As shown in FIG. 14, when the width of the trench TR in the X direction at the position of the upper surface of the semiconductor substrate SUB is defined as W and the radius of curvature of a true circle passing through the deepest portion TRb and the corner portions on the third straight lines SL3 is defined as R, the flat shape and the round shape can be distinguished by using the following "Formula 1". If "Formula 1" is satisfied, the trench TR can be considered to have a flat shape. If "Formula 1" is not satisfied, the trench TR can be considered to have a round shape. Basically, when the radius of curvature R is sufficiently large, the trench TR is distinguished as having a flat shape.

$$R-(W-0.4)>W \,[\mu m] \qquad \qquad \text{:Formula 1}$$

As shown in FIG. 14, in the first embodiment, the trench TR has a flat shape because the relationship of "Formula 1" is satisfied. As shown in FIG. 22, in the studied example, the trench TR has a round shape because the relationship of "Formula 1" is not satisfied.

Figures 15, 16:
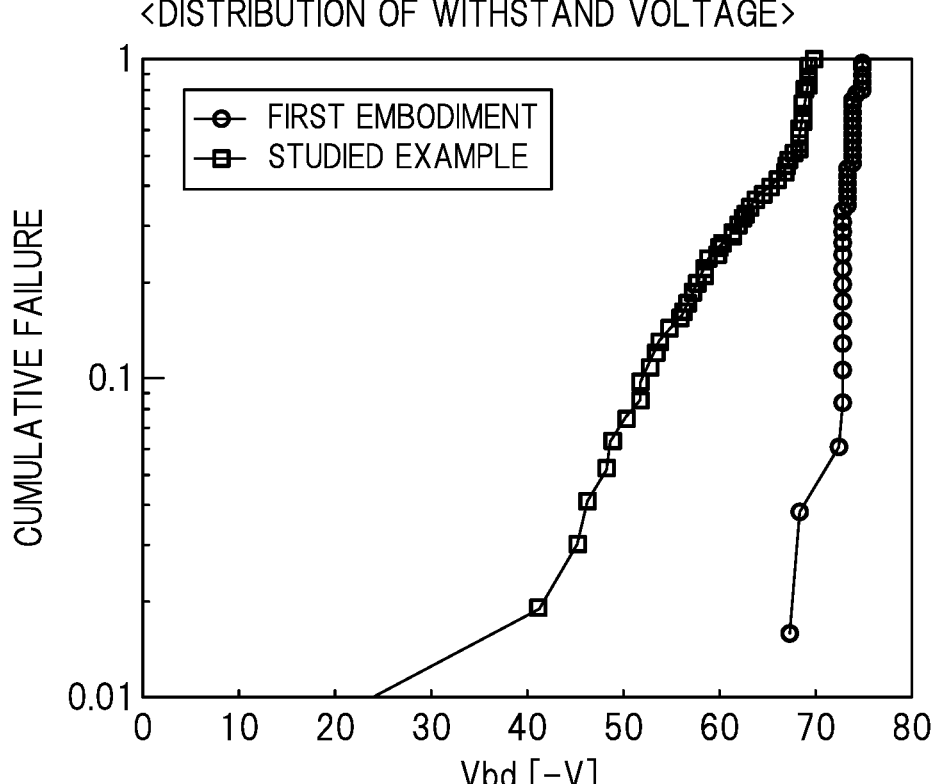
FIG. 15 is a graph showing the distribution of the withstand voltage in the first embodiment and a studied example.
FIG. 16 is a graph showing the TDDB lifetime in the first embodiment and the studied example.

FIG. 15 and FIG. 16 are graphs showing the results of experiments conducted by the inventors of this application, and show the results in the first embodiment and the studied example. FIG. 15 shows the relationship between the breakdown voltage Vbd and the cumulative failures. FIG. 16 shows the time-dependent deterioration (TDDB lifetime) of the gate insulating film GI, namely, the relationship between the voltage Vg applied to the gate electrode GE1 and the mean time to failure. Note that these experiments were conducted under an environment of 150° C.

As shown in FIG. 15, failures (initial failures) occur from the region where the breakdown voltage is small in the studied example, but the initial failures are significantly improved in the first embodiment. It can be said that this result is due to the uniformity of the thickness of the gate insulating film GI obtained by the use of the flat-shaped trench TR.

Also, as shown in FIG. 16, it can be seen that the TDDB lifetime is improved by about two orders of magnitude in the first embodiment. As described above, the reliability of the semiconductor device 100 is further improved in the first embodiment. As a result, it is possible to suppress the decrease in yield and the increase in inspection cost.

Second Embodiment

The semiconductor device 100 according to the second embodiment will be described below with reference to FIG. 17 to FIG. 19. In the following description, differences from the first embodiment will be mainly described, and descriptions of points that overlap with the first embodiment will be omitted.

In the second embodiment, a resistor element RG formed in the resistor region 2A will be described. As shown in FIG. 17, the plurality of trenches TR extend in the Y direction and are next to each other in the X direction. The resistor element RG is formed in each of these trenches TR. Both ends of the resistor element RG are electrically connected to the gate wiring GW via the plug PG. By forming an electric path in the middle of the gate wiring GW with the resistor element RG, the resistor element RG can be used as a gate resistor.

Figure 17:
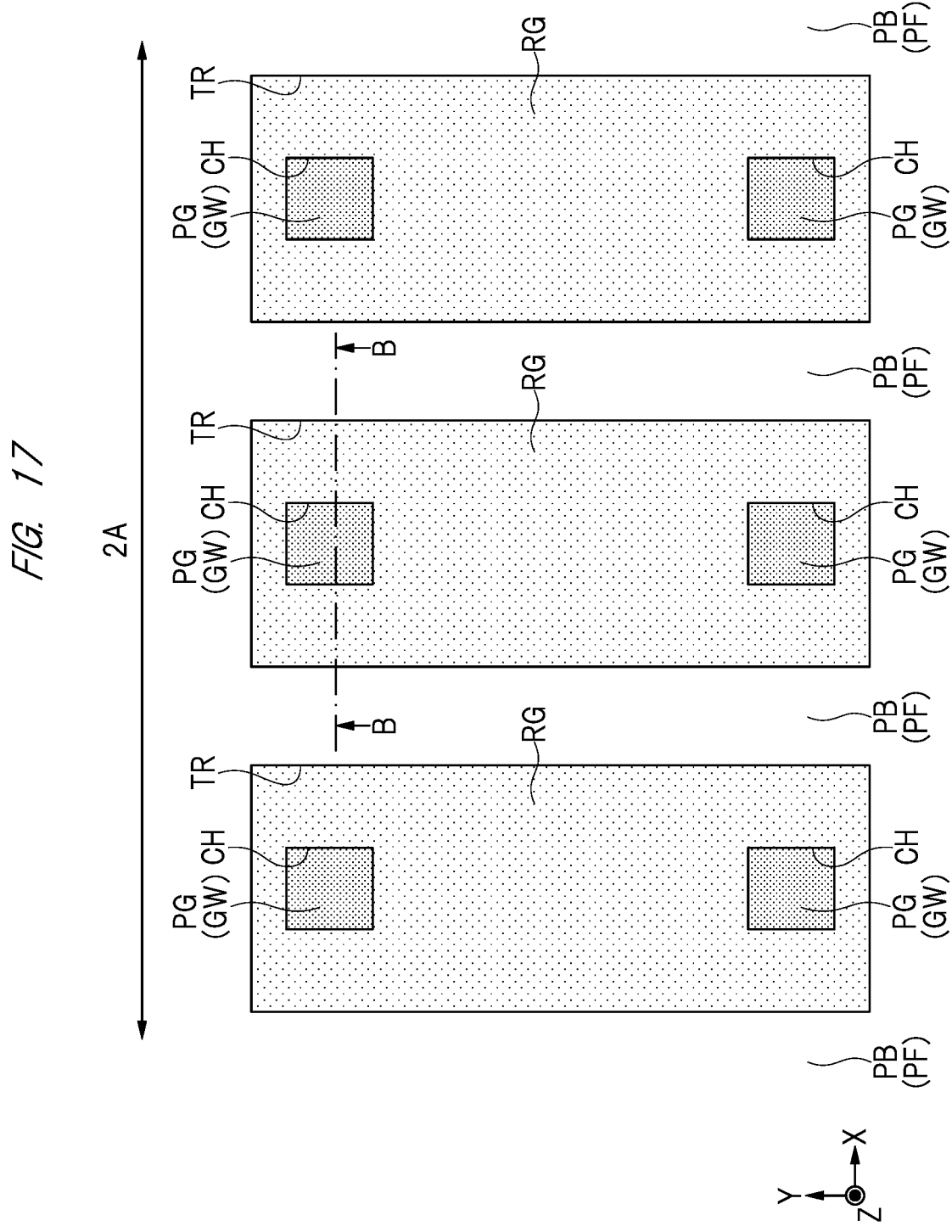
FIG. 17 is a plan view showing the principal part of a semiconductor device according to the second embodiment.
Figure 18:
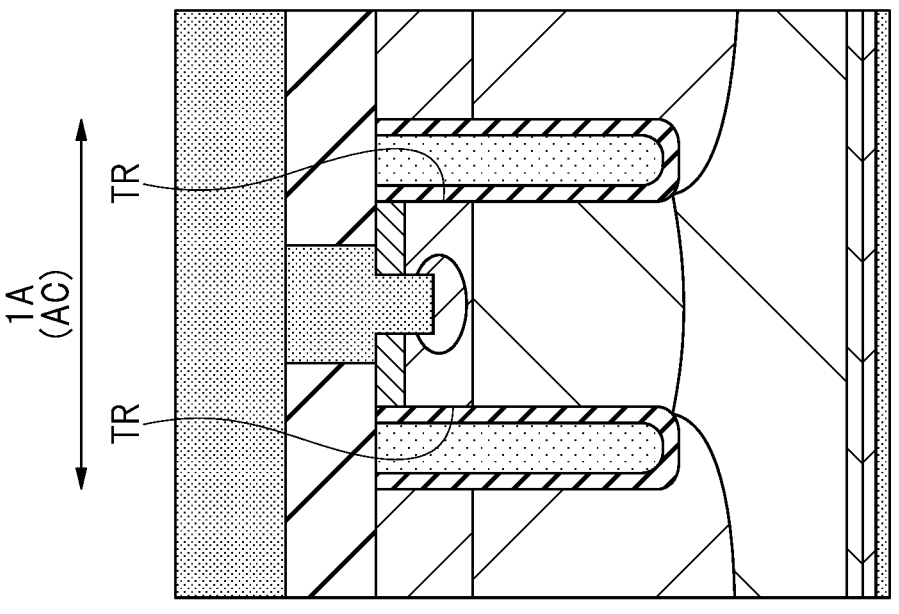
FIG. 18 is a cross-sectional view showing the semiconductor device according to the second embodiment.
Figure 18:
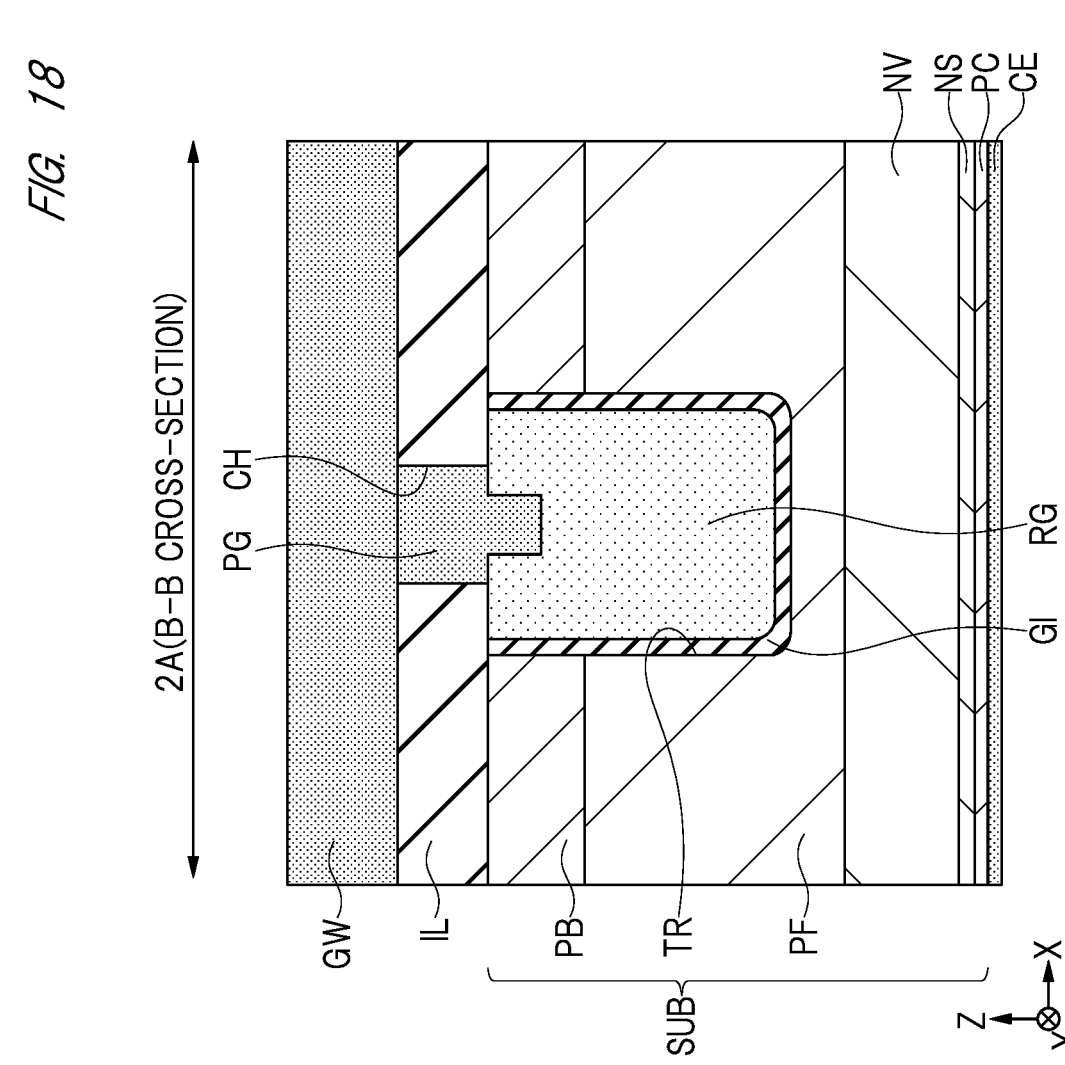

FIG. 18 is a cross-sectional view taken along the line B-B shown in FIG. 17. FIG. 18 also shows a cross-sectional view of the active cell AC in the cell region LA for comparison. The structure of the resistor region 2A is substantially the same as the structure of the cell region LA except that the width of the trench TR in the X direction is larger than that in the cell region LA.

The resistor element RG is buried in the trench TR in the resistor region 2A via the gate insulating film GI. Also, the resistor element RG is formed in the same step as the gate electrodes GE1 and GE2, is formed of the conductive film CF1, and is an n-type polycrystalline silicon film. Further, other structures in the resistor region 2A such as the trench TR and the gate insulating film GI are also formed in the same step as the step of forming the structures in the cell region 1A.

Figure 19:
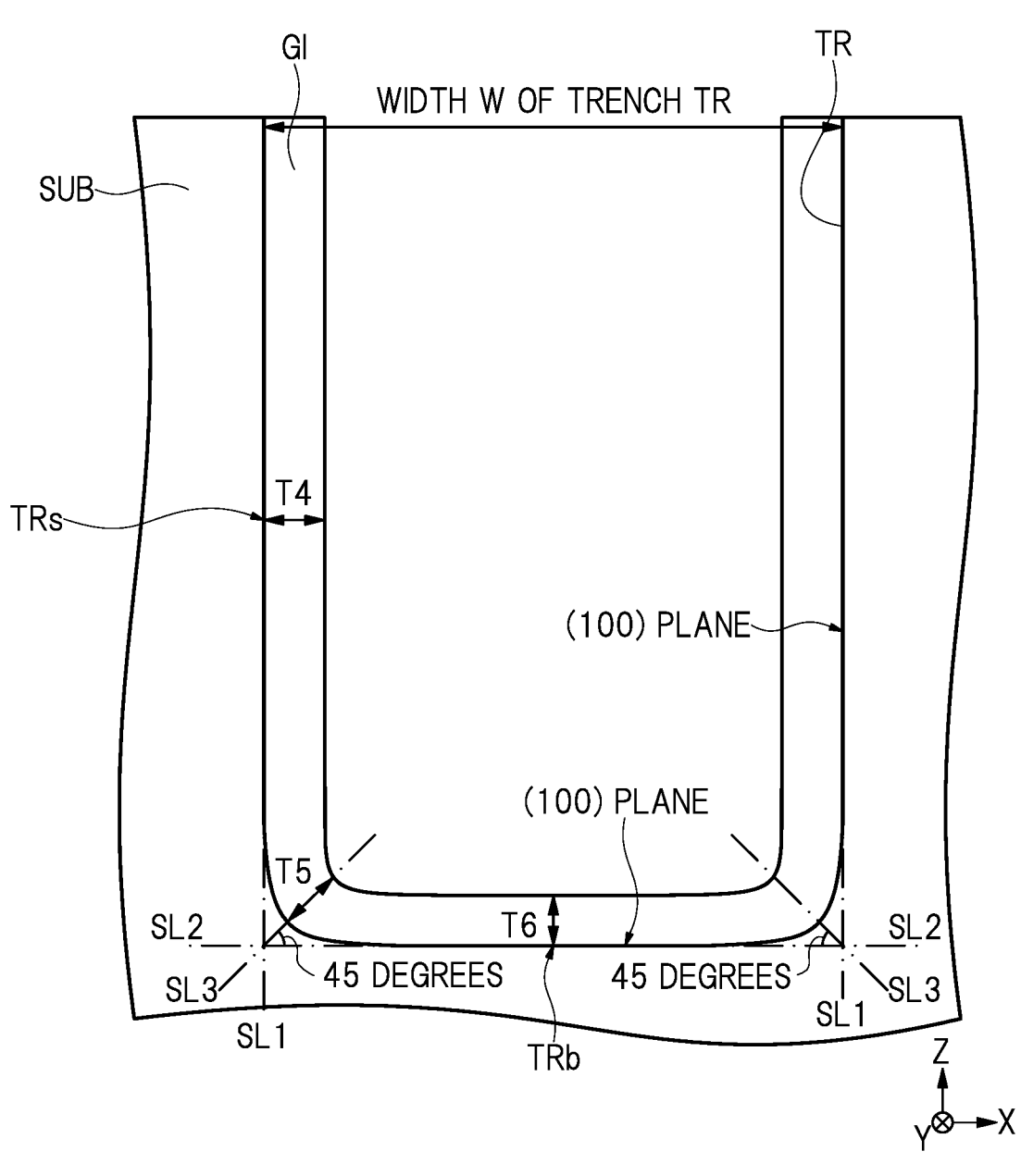
FIG. 19 is an enlarged cross-sectional view showing the semiconductor device according to the second embodiment.

As shown in FIG. 19, similarly to the trench TR in the cell region LA, the trench TR in the resistor region 2A has the sidewall portions including the intermediate portions TRs, the bottom portion including the deepest portion TRb, and the corner portions connecting the sidewall portions and the bottom portion. Further, similarly to the corner portion in the cell region LA, the corner portion in the resistor region 2A has the portion through which the straight line SL3, which extends from an intersecting point between the first straight line SL1 as a tangent line of the intermediate portion TRs and the second straight line SL2 as a tangent line of the deepest portion TRb in a direction inclined by 45 degrees from the second straight line SL2 toward the first straight line SL1, passes.

In FIG. 19, the thickness of the gate insulating film GI formed on the sidewall portion is illustrated as a thickness T4, the thickness of the gate insulating film GI formed on the corner portion is illustrated as a thickness T5, and the thickness of the gate insulating film GI formed on the bottom portion is illustrated as a thickness T6. Note that the thickness T4 is the thickness of the gate insulating film GI at the intermediate portion TRs. Also, the thickness T5 is the thickness of the gate insulating film GI on the third straight line SL3. Further, the thickness T6 is the thickness of the gate insulating film GI at the deepest portion TRb.

Also in the second embodiment, the relationship in the thicknesses of the gate insulating film GI is the same as the relationship in the thicknesses T1, T2, and T3 in the first embodiment. Namely, the thickness T4 and the thickness T5 are each larger than the thickness T6. More specifically, the thickness T4 is larger than the thickness T5, and the thickness T5 is larger than the thickness T6. Further, the absolute value ΔTD of the difference between the thickness T5 and the thickness T6 is smaller than the absolute value ΔTC of the difference between the thickness T5 and the thickness T4.

In addition, in the resistor region 2A, the width of the trench TR in the X direction at the position of the upper surface of the semiconductor substrate SUB is larger than the width of the trench TR in the cell region 1A, and is larger than, for example, 0.8 μm. Also in this case, it is possible to distinguish whether the trench TR has a flat shape or a round shape by the use of "Formula 1" described with reference to FIG. 14. Although the illustration of the radius of curvature R is omitted in FIG. 19, the trench TR in the resistor region 2A has the flat shape like the trench TR in the cell region 1A.

When the gate insulating film GI is formed by performing a thermal oxidation process using water vapor under the condition of 900° C. or higher and 1000° C. or lower, the thickness of the gate insulating film GI on the sidewall portion of the trench TR tends to be larger than the thickness of the insulating film GI on the bottom portion of the trench TR. In particular, when the width of the trench TR at the position of the upper surface of semiconductor substrate SUB is small, this tendency becomes stronger because it becomes difficult for water vapor to reach the bottom portion of the trench TR.

Since the width of the trench TR in the resistor region 2A is larger than the width of the trench TR in the cell region LA, the thickness of the gate insulating film GI on the bottom portion of the trench TR is likely to be larger in the resistor region 2A than in the cell region LA. Therefore, although there is a certain difference between the thickness T2 and the thickness T3 in the cell region LA, the thickness T6 is close to the thickness T5 in the resistor region 2A. In other words, the difference between the absolute value ΔTC and the absolute value ΔTD in the resistor region 2A is smaller than the difference between the absolute value ΔTA and the absolute value ΔTB in the cell region LA. Namely, the uniformity of the thickness of the gate insulating film GI is enhanced in the entire trench TR.

Incidentally, as another method of incorporating a resistor element in the semiconductor device 100, for example, a method of forming a resistor element by forming a thick insulating film on the upper surface of the semiconductor substrate SUB, forming a polycrystalline silicon film on the insulating film, and patterning the polycrystalline silicon film is known. In this case, the withstand voltage between the resistor element and the semiconductor substrate SUB can be ensured by adjusting the thickness of the insulating film.

In the case of the resistor element RG in the second embodiment, the structure around the resistor element RG is formed in the same steps as those of forming the trench TR, the gate insulating film GI, and the gate electrodes GE1 and GE2. Therefore, the manufacturing steps can be simplified, and the increase in manufacturing cost can be suppressed. On the other hand, the withstand voltage between the resistor element RG and the semiconductor substrate SUB depends on the gate insulating film GI.

In the resistor region 2A of the second embodiment, since the uniformity of the thickness of the gate insulating film GI is enhanced in the vicinity of the bottom portion of the trench TR, a portion locally having a low withstand voltage is less likely to be formed. Therefore, since the withstand voltage of the resistor element RG can be improved, the reliability can be improved also in the semiconductor device 100 including such a resistor element RG.

In the foregoing, the present invention has been specifically described based on embodiments. However, the present invention is not limited to these embodiments and can be modified in various ways within the range not departing from the gist thereof.

What is claimed is:

1. A semiconductor device comprising:

a semiconductor substrate of a first conductivity type having an upper surface and a lower surface;

a first trench formed in the semiconductor substrate on an upper surface side of the semiconductor substrate;

a first insulating film formed in the first trench; and a conductive film buried in the first trench via the first insulating film, wherein a surface of the first trench has:

a first sidewall portion formed from the upper surface of the semiconductor substrate toward an inside of the semiconductor substrate to a predetermined depth;

a first bottom portion located inside the semiconductor substrate; and a first corner portion connecting the first sidewall portion and the first bottom portion, wherein an absolute value $\Delta TB$ of a difference between a thickness of the first insulating film formed on the first corner portion and a thickness of the first insulating film formed on the first bottom portion is smaller than an absolute value $\Delta TA$ of a difference between the thickness of the first insulating film formed on the first corner portion and a thickness of the first insulating film formed on the first sidewall portion, and wherein a crystal plane of the semiconductor substrate at each of the first sidewall portions, the first bottom portion, and the first corner portions is a (100) plane.

2. The semiconductor device according to claim 1, wherein the first bottom portion includes a deepest portion whose depth from the upper surface of the semiconductor substrate is the largest, wherein the first sidewall portion includes an intermediate portion located at half the depth from the upper surface of the semiconductor substrate to the deepest portion, wherein the thickness of the first insulating film formed on the first bottom portion is a thickness of the first insulating film at the deepest portion, and wherein the thickness of the first insulating film formed on the first sidewall portion is a thickness of the first insulating film at the intermediate portion.

3. The semiconductor device according to claim 2, wherein the thickness of the first insulating film formed on the first corner portion is a thickness of the first insulating film on a third straight line which extends from an intersecting point between a first straight line as a tangent line of the intermediate portion and a second straight line as a tangent line of the deepest portion in a direction inclined by 45 degrees from the second straight line toward the first straight line.

4. The semiconductor device according to claim 3, wherein the first trench extends in a first direction in plan view, and wherein, when a width of the first trench in a second direction orthogonal to the first direction in plan view at a position of the upper surface of the semiconductor substrate is defined as W and a radius of curvature of a true circle passing through the deepest portion and the first corner portion on the third straight line is defined as R, the first trench satisfies a relationship of "$R-(W-0.4)>W$ [μm]".

5. The semiconductor device according to claim 1, comprising:

a base region of a second conductivity type opposite to the first conductivity type formed in the semiconductor substrate on the upper surface side of the semiconductor substrate so as to be shallower than the first trench;

an emitter region of the first conductivity type formed in the base region;

a collector electrode formed on the lower surface of the semiconductor substrate;

an interlayer insulating film formed on the upper surface of the semiconductor substrate so as to cover the first trench; and a gate wiring and an emitter electrode formed on the interlayer insulating film, wherein the emitter region and the base region are electrically connected to the emitter electrode, wherein the conductive film is electrically connected to the gate wiring and functions as a gate electrode, and wherein the first insulating film functions as a gate insulating film.

6. The semiconductor device according to claim 5, comprising:

a second trench formed in the semiconductor substrate on the upper surface side of the semiconductor substrate;

a second insulating film formed in the second trench; and a resistor element buried in the second trench via the second insulating film, wherein, at a position of the upper surface of the semiconductor substrate, a width of the second trench in a direction orthogonal to an extending direction of the second trench in plan view is larger than a width of the first trench in a direction orthogonal to an extending direction of the first trench in plan view, wherein the second trench includes:

a second sidewall portion formed from the upper surface of the semiconductor substrate toward an inside of the semiconductor substrate to a predetermined depth;

a second bottom portion located inside the semiconductor substrate; and a second corner portion connecting the second sidewall portion and the second bottom portion, wherein an absolute value $\Delta TD$ of a difference between a thickness of the second insulating film formed on the second corner portion and a thickness of the second insulating film formed on the second bottom portion is smaller than an absolute value $\Delta TC$ of a difference between the thickness of the second insulating film formed on the second corner portion and a thickness of the second insulating film formed on the second sidewall portion, and wherein a difference between the absolute value $\Delta TC$ and the absolute value $\Delta TD$ is smaller than a difference between the absolute value $\Delta TA$ and the absolute value $\Delta TB$.

7. A method of manufacturing a semiconductor device, the method comprising:

(a) preparing a semiconductor substrate of a first conductivity type having an upper surface and a lower surface;

(b) forming a first trench in the semiconductor substrate on an upper surface side of the semiconductor substrate;

(c) forming a first insulating film in the first trench; and (d) forming a conductive film so as to fill the first trench via the first insulating film, wherein a surface of the first trench has:

a first sidewall portion formed from the upper surface of the semiconductor substrate toward an inside of the semiconductor substrate to a predetermined depth;

a first bottom portion located inside the semiconductor substrate; and a first corner portion connecting the first sidewall portion and the first bottom portion, wherein an absolute value $\Delta$TB of a difference between a thickness of the first insulating film formed on the first corner portion and a thickness of the first insulating film formed on the first bottom portion is smaller than an absolute value $\Delta$TA of a difference between the thickness of the first insulating film formed on the first corner portion and a thickness of the first insulating film formed on the first sidewall portion, and wherein a crystal plane of the semiconductor substrate at each of the first sidewall portions, the first bottom portion, and the first corner portions is a (100) plane.

8. The method according to claim 7, wherein, in the (b), a dry etching process using $C_4F_8$ gas and $SF_6$ gas is performed.

9. The method according to claim 7, wherein, in the (c), a thermal oxidation process using water vapor under a condition of 900° C. or higher and 1000° C. or lower is performed.

10. The method according to claim 7, wherein the first bottom portion includes a deepest portion whose depth from the upper surface of the semiconductor substrate is the largest, wherein the first sidewall portion includes an intermediate portion located at half the depth from the upper surface of the semiconductor substrate to the deepest portion, wherein the thickness of the first insulating film formed on the first bottom portion is a thickness of the first insulating film at the deepest portion, and wherein the thickness of the first insulating film formed on the first sidewall portion is a thickness of the first insulating film at the intermediate portion.

11. The method according to claim 10, wherein the thickness of the first insulating film formed on the first corner portion is a thickness of the first insulating film on a third straight line which extends from an intersecting point between a first straight line as a tangent line of the intermediate portion and a second straight line as a tangent line of the deepest portion in a direction inclined by 45 degrees from the second straight line toward the first straight line.

12. The method according to claim 11, wherein the first trench extends in a first direction in plan view, and wherein, when a width of the first trench in a second direction orthogonal to the first direction in plan view at a position of the upper surface of the semiconductor substrate is defined as W and a radius of curvature of a true circle passing through the deepest portion and the first corner portion on the third straight line is defined as R, the first trench satisfies a relationship of "R–(W–0.4)>W [μm]".

13. The method according to claim 7, comprising:

(e) forming a base region of a second conductivity type opposite to the first conductivity type in the semiconductor substrate on the upper surface side of the semiconductor substrate so as to be shallower than the first trench;

(f) forming an emitter region of the first conductivity type in the base region;

(g) forming an interlayer insulating film on the upper surface of the semiconductor substrate so as to cover the first trench;

(h) forming a gate wiring and an emitter electrode on the interlayer insulating film; and (i) forming a collector electrode on the lower surface of the semiconductor substrate, wherein the emitter region and the base region are electrically connected to the emitter electrode, wherein the conductive film is electrically connected to the gate wiring and functions as a gate electrode, and wherein the first insulating film functions as a gate insulating film.

14. The method according to claim 13, wherein, in the (a), a second trench is formed in the semiconductor substrate on the upper surface side of the semiconductor substrate, wherein, in the (b), a second insulating film is formed in the second trench, wherein, in the (c), a resistor element is buried in the second trench via the second insulating film, wherein, at a position of the upper surface of the semiconductor substrate, a width of the second trench in a direction orthogonal to an extending direction of the second trench in plan view is larger than a width of the first trench in a direction orthogonal to an extending direction of the first trench in plan view, wherein the second trench includes:

a second sidewall portion formed from the upper surface of the semiconductor substrate toward an inside of the semiconductor substrate to a predetermined depth;

a second bottom portion located inside the semiconductor substrate; and a second corner portion connecting the second sidewall portion and the second bottom portion, wherein an absolute value $\Delta$TD of a difference between a thickness of the second insulating film formed on the second corner portion and a thickness of the second insulating film formed on the second bottom portion is smaller than an absolute value $\Delta$TC of a difference between the thickness of the second insulating film formed on the second corner portion and a thickness of the second insulating film formed on the second sidewall portion, and wherein a difference between the absolute value $\Delta$TC and the absolute value $\Delta$TD is smaller than a difference between the absolute value $\Delta$TA and the absolute value $\Delta$TB.

15. The method according to claim 7, wherein, in the (b), a dry etching process including a first plasma process using $C_4F_8$ gas, a second plasma process using $SF_6$ gas, and a third plasma process using $SF_6$ gas at a voltage lower than that of the second plasma process is defined as one cycle, and the dry etching process is repeated in a plurality of cycles, whereby the first trench is formed.

* * * * *